(12) United States Patent
Demir et al.

(10) Patent No.: US 10,274,557 B2
(45) Date of Patent: Apr. 30, 2019

(54) ENHANCEMENT OF MAGNETIC RESONANCE IMAGE RESOLUTION BY USING BIO-COMPATIBLE, PASSIVE RESONATOR HARDWARE

(71) Applicant: Hilmi Volkan Demir, Ankara (TR)

(72) Inventors: Hilmi Volkan Demir, Ankara (TR); Sayim Gokyar, Ankara (TR); Emre Unal, Ankara (TR)

(*) Notice: Subject to any disclaimer, the term of this patent is extended or adjusted under 35 U.S.C. 154(b) by 610 days.

(21) Appl. No.: 14/774,138

(22) PCT Filed: Mar. 14, 2014

(86) PCT No.: PCT/TR2014/000083
§ 371 (c)(1),
(2) Date: Sep. 10, 2015

(87) PCT Pub. No.: WO2014/142772
PCT Pub. Date: Sep. 18, 2014

(65) Prior Publication Data
US 2016/0033592 A1    Feb. 4, 2016

(30) Foreign Application Priority Data
Mar. 14, 2013  (TR) ............................. a 2013 03085

(51) Int. Cl.
*G01R 33/34* (2006.01)
*G01R 33/28* (2006.01)
*G01R 33/36* (2006.01)

(52) U.S. Cl.
CPC ..... *G01R 33/34053* (2013.01); *G01R 33/286* (2013.01); *G01R 33/287* (2013.01);
(Continued)

(58) Field of Classification Search
CPC .......... G01R 33/340853; G01R 33/286; G01R 33/287; G01R 33/34007; G01R 33/34084; G01R 33/3628
See application file for complete search history.

(56) References Cited

U.S. PATENT DOCUMENTS 6,280,385 B1   8/2001   Melzer
6,767,360 B1   7/2004   Alt et al.
(Continued)

FOREIGN PATENT DOCUMENTS

EP   1471363 A2   10/2004
EP   1666908 A1    6/2007

OTHER PUBLICATIONS

M. J. Freire et al., Experimental demonstration of a mu=-1 metamaterial lens for magnetic resonance imaging, Applied Physics Letters, 93, 231108 (2008).
(Continued)

*Primary Examiner* — Gregory H Curran

(57) ABSTRACT

Embodiments of the present invention address the problems with previously known MRI enhancement resonators. The embodiments provide capacitances that are sufficiently large to result in resonance frequencies that are sufficiently low for medical MRI applications in devices that are sufficiently small for implantation into the body. Further, the capacitance and resonance frequency of the MRI enhancement resonator may be easily adjusted to particular desired values by selecting corresponding thin-film dielectrics, or thicknesses of such thin-film dielectrics. Moreover, the design and geometry of the embodiments provide MRI enhancement resonators with high Q-factors. The construction and material of such MRI enhancement resonators also yield flexible and biocompatible devices that are appropriate for applications involving implantation into the body.

18 Claims, 27 Drawing Sheets

(52) U.S. Cl.
CPC . *G01R 33/34007* (2013.01); *G01R 33/34084* (2013.01); *G01R 33/3628* (2013.01)

(56) References Cited

U.S. PATENT DOCUMENTS

| | | |
|---|---|---|
| 7,279,664 B2 | 10/2007 | Weber |
| 7,304,277 B2 | 12/2007 | Weber |
| 7,335,229 B2 | 2/2008 | Alt et al. |
| 7,423,496 B2 | 9/2008 | Scheuermann |
| 7,595,469 B2 | 9/2009 | Weber |
| 7,766,958 B2 | 8/2010 | Alt et al. |
| 7,778,684 B2 | 8/2010 | Weber et al. |
| 7,812,290 B2 | 10/2010 | Weber |
| 7,838,806 B2 | 11/2010 | Weber |
| 7,988,719 B2 | 8/2011 | Alt et al. |
| 8,046,048 B2 | 10/2011 | Scheuermann |
| 8,058,593 B2 | 11/2011 | Weber |
| 8,066,759 B2 | 11/2011 | Weber et al. |
| 2004/0254632 A1 | 12/2004 | Alt |
| 2006/0119359 A1* | 6/2006 | Hasegawa ........ G01R 33/34053 324/318 |
| 2007/0032862 A1 | 2/2007 | Weber et al. |
| 2007/0062933 A1 | 3/2007 | Weber |
| 2007/0100231 A1 | 5/2007 | Gray et al. |
| 2007/0239256 A1 | 10/2007 | Weber et al. |
| 2008/0164960 A1 | 7/2008 | Schnell et al. |
| 2008/0278166 A1* | 11/2008 | Wosik .............. G01R 33/34007 324/318 |
| 2010/0030319 A1 | 2/2010 | Weber |
| 2010/0033178 A1 | 2/2010 | Lee et al. |
| 2010/0127707 A1 | 5/2010 | Lee et al. |
| 2011/0101977 A1* | 5/2011 | Nakanishi .......... G01R 33/3692 324/307 |

OTHER PUBLICATIONS

R.R.A. Syms et al., Thin Film Detector Systems for Internal Magnetic Resonance Imaging, Sensors and Actuators A163, 15-24 (2010).
M.S. Khennouche et al., The Use of Metamaterials: a Solution to Improve the Performance of Radiofrequency Coil for Magnetic Resonance Imaging (MRI)?, Metamaterials 2011: The Fifth International Congress on Advanced Electromagnetic Materials in Microwaves and Optics (2011).
International Preliminary Report on Patentability for WO2014/142772, dated Jul. 15, 2015.
International Preliminary Report on Patentability for WO2014/142772, dated Sep. 22, 2015.
Written Opinion of the ISA for WO2014/142772.
Written Opinion of the International Preliminary Examination Authority for WO2014/142772, dated Apr. 20, 2014.
Search Report for Turkish patent application 2013 03085.
ISR for WO2014/142772.

* cited by examiner

ENHANCEMENT OF MAGNETIC RESONANCE IMAGE RESOLUTION BY USING BIO-COMPATIBLE, PASSIVE RESONATOR HARDWARE

FIELD OF THE EMBODIMENTS OF THE INVENTION

Embodiments of the present invention generally relate to enhancement of magnetic resonance (MR) image resolution, and more specifically relate to enhancement of MR image resolution using bio-compatible and passive resonator hardware that may optionally be flexible for medical applications.

BACKGROUND OF EMBODIMENTS OF THE INVENTION

Magnetic resonance imaging (MRI) is an enabling technology platform in biomedical imaging that offers a wide variety of diagnoses including investigation of tumor sizes, detection of restenosis of vessels or stent lumen, imaging of neural signals (fMRI) and the observation of tissue and tissue regeneration during the making of and after incisions. MRI has evolved into a major imaging tool in medicine due to its non-invasive and safe nature.

The MR imaging technique exploits the interaction of applied magnetic fields with nuclei in the target area of the material of interest (such as a portion of a patient's body), and the detection of signals resulting from that interaction. In the technique, a strong static applied magnetic field splits energy levels of the nuclei of interest based on the interaction of the spin of the nuclei and the static field, and a time-varying magnetic field is tuned to the resonance frequency corresponding to the split energy levels. Resonance transitions, which indicate the presence of nuclei of interest, cause a change in magnetic field, which may be detected by receiver coils and processed into an image depicting the positional distribution of the nuclei of interest.

In medical imaging, the hydrogen atom (H), which is abundant in all organic tissue, is the nucleus of interest, and hence the properties of H have the key role in determining the operating MR frequency. Hydrogen atoms, which are aligned in the direction of the static magnetic field, are excited with a radio frequency (RF) field to absorb incident energy. This energy is re-emitted to the environment in accordance with relaxation times that depend on the type of the tissue containing the excited H nuclei of interest. The receiver coils detect the resulting signals, which are processed into an image.

The relationship between the resonance frequency ($f_{res}$) of H and the magnetic flux density (B) is given by Equation 1.

$$f_{res} = \frac{\gamma}{2\pi} B \qquad \text{Equation 1}$$

Where, Equation 1', $\gamma$ is the gyromagnetic ratio of H and has a value of 42.575 MHz/Tesla. Commercially available MRI scanners for use with humans apply static magnetic fields in a range of approximately 0.5 to 7 Tesla, which correspond to resonance frequencies in H that vary between approximately 21.2 to 300 MHz, respectively. The most widely used systems for medical imaging apply static magnetic fields in the range of approximately 1.5 to 3 Tesla, which corresponds to resonance frequencies in the range of approximately 64 to 127 MHz, respectively.

For some tissue, due to the lack of hydrogen atoms in the target area, or small volume of the target area, it is difficult to obtain a good MRI signal to construct a meaningful image. Additionally, in cases where an implant has been inserted into the patient, obtaining MR images of the area of the body near the implant may be of interest. However, in many cases, the presence of the implant renders that area opaque to magnetic fields, leading to small or poor MRI signals that are not adequate for the desired imaging.

One way of trying to overcome such problems involves the transmission of higher power for absorption by the tissue of interest (e.g., by increasing the intensity of the applied time-varying magnetic field), potentially leading to higher amplitude signal emission from the tissue. However, increasing the absorption of power by tissue may cause undesired and potentially harmful heating of the tissue. In certain cases, such heating may damage the tissue irreversibly.

Another approach involves, as an alternative to increasing transmitted power to the tissue of interest, focusing and rendering more intense the applied time-varying magnetic field at only the points of interest or in an area that is relatively localized around the points of interest. An electrical resonator whose resonance frequency matches the frequency of the time-varying magnetic field that is applied and that is located at or near the points of interest may enhance localization of the time-varying magnetic field in its vicinity, and lead to the emission of a stronger or higher-quality signal from the points of interest. Such a resonator couples the emitted signal to the receiver coil without necessitating a wired connection.

As depicted in FIG. 1, a resonator (110) may comprise an electrical circuit that includes ideal lumped circuit elements, such as an inductor (L), capacitors (C and $C_{gap}$), and a resistor (R). In the embodiment of FIG. 1, each of the inductor and capacitors are separate elements (i.e., lumped elements).

FIG. 2 depicts a known physical layout of a resonator embodiment (210), which may be modeled by the ideal circuit depicted in FIG. 1. Resonator 210 (which is also called a "split-ring resonator") includes semi-ring (220) that is formed from a metallic or conductive, semi-circular element, and gap (230), which is an interruption of the conductive path formed by semi-ring (220), and which may comprise either empty space or a dielectric material. A time-varying magnetic field that is applied to semi-ring (220) induces a time-varying current in semi-ring (220) in accordance with Faraday's law; thus semi-ring (220) may be modeled as an inductor (L). Additionally, the metal or conductor forming semi-ring (220) may have a resistance (R). Furthermore, the presence of gap (230) (including any dielectric material formed therein) may cause charge build-up on the parts of semi-ring (220) adjacent to gap (230) when an electrical current is applied or is present in semi-ring (220). For that reason, gap (230) (including any dielectric material formed therein) and the relevant adjacent parts of semi-ring (220) may be modeled as a capacitor (C). Thus, resonator (210) effectively forms a resonant RLC circuit. As is known to those of ordinary skill in the art, the resonant frequency of such an RLC circuit is given by Equation 12.

$$f_{resRLC} = \frac{1}{2\pi \sqrt{L_{etkin} C_{etkin}}} \qquad \text{Equation 2}$$

A time-varying current induced in resonator (210) in turn generates a time-varying magnetic field in accordance with the displacement current term in Ampere's law and the right-hand rule. The magnetic field that is generated is in a direction that is normal to the plane containing resonator (210), with the exact direction (i.e., whether the direction is into the plane or out of the plane containing resonator (210) along the normal direction) of the magnetic field depending on the direction of the induced current in resonator (210) in accordance with the right-hand rule.

As is known to those of ordinary skill in the art, a parameter that characterizes a resonant LCR circuit is its quality factor (Q-factor) that is given in Equation 3.

$$Q = \frac{2\pi f_{resRLC} \cdot L}{R} \qquad \text{Equation 3}$$

The Q-factor provides an easily calculable measure of the strength of a resonance of a resonator, with high values of Q corresponding to a highly resonant circuit in which the resonance is observed over a narrow bandwidth of frequencies.

If the resonance frequency ($f_{resRLC}$) of resonator (110) is the same or approximately the same as the frequency of the applied time-varying magnetic field of the MRI device, resonator (110) will effectively amplify the total time-varying magnetic field (compared to the situation in which resonator (110) is not present) in the vicinity of resonator (110). This, in turn, will cause an enhanced MR signal to be received from those portions of the target area for imaging that are in the vicinity of resonator (110).

There have been previous efforts to utilize a resonator to enhance the signal generated during a MRI measurement. In particular, resonator structures have been proposed for MRI signal and resolution enhancement that include a lumped capacitor. For example, U.S. patent publication nos. U.S. 2010/0127707 and U.S. 2010/0033178 disclose various embodiments of a split-ring resonator (SRR), similar to the embodiment discussed above in connection with FIG. 2, in which the capacitor is a lumped circuit element that is formed from the end of the SRR, which faces each other and the gap (230) separates the two ends. In one embodiment, U.S. 2010/0127707 discloses a resonator comprising two square-shaped split-ring resonators (where the two square-shaped split-ring resonators are not in conductive contact with one another) that are oriented parallel to one another and axially aligned, with a dielectric layer sandwiched between the two square-shaped split-ring resonators.

Another lumped-capacitor approach has been suggested in the context of a resonator that is part of or attached to the scaffold part of a stent for implantation in the body of a human. For example U.S. 2007/0239256 describes a stent structure with a sheath that includes two distinct coils with a capacitor placed between the two coils. Similar or analogous embodiments that include lumped capacitors are disclosed in, for example, U.S. Pat. Nos. 6,767,360; 7,279,664; 7,304,277; 7,335,229; 7,423,496; 7,595,469; 7,766,958; 7,778,684; 7,812,290; 7,838,806; 7,988,719; 8,046,048; 8,058,593; 8,066,759 and applications U.S. 2010/0286764; U.S. 2008/012854; U.S. 2007/0062933; U.S. 2007/0032862; U.S. 2004/0254632.

Lumped capacitors in MRI-enhancement resonators are too bulky and mostly not biocompatible, and therefore not suitable for implantation into the body. Generally, the capacitance values achievable through a lumped capacitor are not sufficiently high to yield resonant frequencies for the corresponding resonator that are sufficiently low for MRI applications, when the dimensions of the resonator are sufficiently small for purposes of implantation into the human body. Such structures cannot be implanted in the body for medical purposes, and usually may only be used as external surface MRI enhancement resonators. See M. J. Freire et al., "Experimental demonstration of a µ=−1 metamaterial lens for magnetic resonance imaging; Applied Physics Letters, 93, 231108 (2008)."

Another disadvantage of a resonator that includes a lumped capacitor is that it usually causes imaging artifacts such as black spots in the resulting MR image, due to the fact that the electric field of the capacitor leaks outside the volume enclosed by the capacitor.

Flexible and biocompatible resonators with wired connections to the detector device have been proposed that use capacitors with thin film dielectrics. Such resonators may in principle be implanted into the body. However, such devices are also not sufficiently small, and the need for a wired connection prevents or complicates applications that envision implantation of the device into the human body. See, e.g., R. R. A. Syms et al., "Thin Film Detector Systems for Internal Magnetic Resonance Imaging", Sensors and Actuators A 163, 15-24, (2010).

Thus, there is a need for a resonator for MRI enhancement that is sufficiently small to be used in in-vivo applications, that does not impair the resulting MRI image, and that provides effective MR image or resolution enhancement. Such a resonator should be biocompatible, compact and small, not wired, and preferably, flexible.

SUMMARY OF EMBODIMENTS OF THE INVENTION

Embodiments of the invention include a helical resonator for use as a magnetic resonance imaging enhancement device comprising a conductive helical ring including at least two turns, and a dielectric layer located between the at least two turns of the conductive helical ring, wherein each turn of the at least two turns is non-negligibly capacitively coupled to at least one other turn of the helical resonator.

Embodiments of the invention also include a helical resonator for use as a magnetic resonance imaging enhancement device comprising a conductive helical ring including at least two turns, and a dielectric layer located between the at least two turns of the conductive helical ring, wherein each turn of the at least two turns has a non-negligible width in planes substantially perpendicular to a main axis of the helical ring.

In one particular exemplary embodiment, the helical resonator for use as a magnetic resonance imaging enhancement device comprises a conductive helical ring including at least two turns, and a dielectric layer located between the at least two turns of the conductive helical ring, wherein each turn of the at least two turns has a non-negligible width in planes substantially perpendicular to a main axis of the helical ring. Further, each turn of the at least two turns of the helical resonator (comprising, for example, one full turn and one partial turn) has a non-negligible length in directions substantially parallel to the main axis of the helical ring. Additionally, the at least two turns of the conductive helical ring comprise a conductive path that has a substantially semi-circular or polygonal cross section. In this particular exemplary embodiment, the helical resonator is manufactured by microfabrication, and, as a result of the configuration of the helical resonator as described, each turn of the at least two turns of the helical resonator is non-negligibly capacitively coupled to at least one other turn of the helical resonator. Moreover, there is a dielectric layer comprising a planar, thin-film dielectric that is formed substantially in the spacing between the first turn and second turn of the helical resonator.

In a variation of this particular exemplary embodiment, the helical resonator as described in the particular exemplary embodiment additionally comprises at least one via metallization, and each turn of the at least two turns of the conductive helical ring comprises a conductive path that has a gap, wherein each of the gaps of the at least two turns are substantially aligned, and wherein the at least one via metallization.

Persons skilled in the art will recognize from this summary and the disclosure below that the described embodiments are not limiting, and may be practiced with modifications and alterations limited only by the spirit and scope of the appended claims which are intended to cover such modifications and alterations, so as to afford broad protection to the various embodiments of the invention and their equivalents.

REFERENCE LIST

Figure 1:
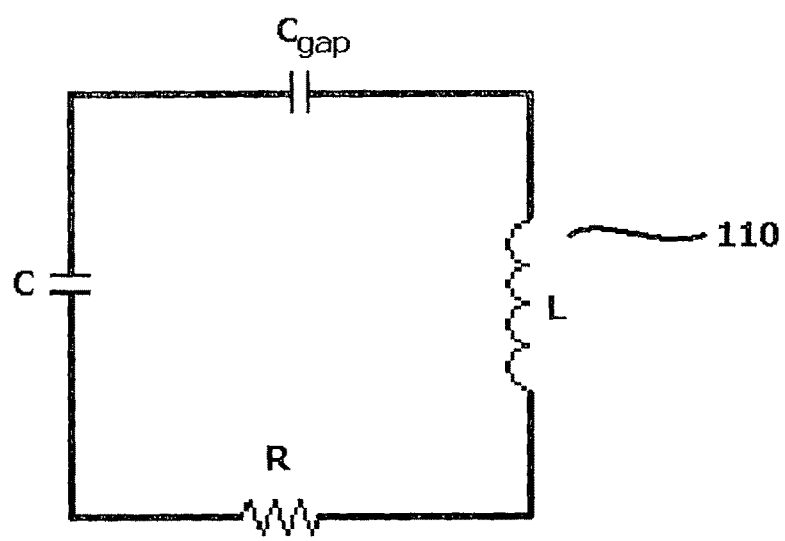
FIG. 1 depicts a previously known LRC circuit.

110: Equivalent circuit of the resonator
210: Resonator
220: Conductive semi-ring
230: Gap
310: Helical ring resonator
320: Dielectric layer
410: Helical ring resonator
420: Dielectric layer
430: First Ring
440: Second ring
450: Via metallization
470: Gap
480: Gap
510: Helical ring resonator with square cross section
520: Dielectric layer
530: First square shaped conductive element
540: Second square shaped conductive element
550: Via metallization
610: Helical ring resonator with hexagonal cross section
620: First hexagonal conductive element
630: Dielectric layer
640: Second hexagonal conductive element
650: Via metallization
710: Helical ring resonator with rectangular cross section
810: Three layer helical ring resonator 820: First dielectric layer
830: First conductive square shaped element
840: Second conductive square shaped element
850: Third conductive square shaped element
860: Second dielectric layer
870: First via metallization
880: Second via metallization
910: Magnetic resonance imaging (MRI) device
920: RF coil
930: Supporting pad
940: Patient table
950: Phantom
960: Slice
970: Resonator
1350: Phantom
1360: Slice
1710: Helical resonator with arbitrary cross section
1720: Outer ring
1730: Inner ring
1740: Dielectric Region
1760: Via metallization
1805: Photo-resist coating
1810: UV lithography
1815: Metallization
1820: Lift-off of the photo-resist and rapid thermal annealing
1825: Electroplating
1830: Polishing
1835: Dielectric coating
1840: Opening of via metallization
1845: Metallization
1850: UV lithography
1855: Metallization
1860: Lift-off of the photo-resist and rapid thermal annealing
1865: Electroplating
1905: Photo-resist coating
1910: UV lithography
1915: Metallization and lift-off
1920: Turning upside down of the polyimide film
1925: UV lithography
1930: Metallization and lift-off of the photo-resist
1935: Opening of via metallization and rapid thermal annealing
1940: Top layer electroplating
1945: Turning upside down of polyimide film
1950: Bottom layer electroplating
1955: Coating of isolation layer
2720: Top ring
2740: Via metallization
2750: Bottom ring

DESCRIPTION OF EMBODIMENTS OF THE INVENTION

Embodiments of the present invention address the problems with previously known MRI enhancement resonators. The embodiments provide capacitances that are sufficiently large to result in resonance frequencies that are sufficiently low for medical MRI applications in devices that are sufficiently small for implantation into the body. Further, the capacitance and resonance frequency of the MRI enhancement resonator may be easily adjusted to particular desired values by selecting corresponding thin-film dielectrics, or thicknesses of such thin-film dielectrics. Moreover, the design and geometry of the embodiments provide MRI enhancement resonators with high Q-factors. The construction and material of such MRI enhancement resonators also yield flexible and biocompatible devices that are appropriate for applications involving implantation into the body.

Figure 3:
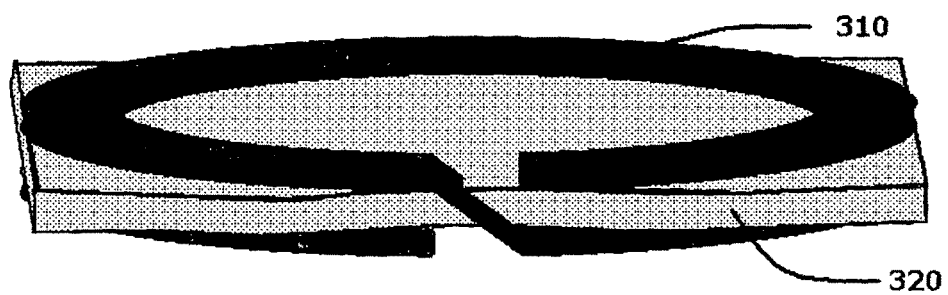
FIG. 3 depicts an embodiment of a helical resonator (310) comprising a helical ring in accordance with the present invention.

FIG. 3 depicts a basic embodiment of the present invention. In the embodiment of FIG. 3, helical ring (310), which is a resonator, comprises a strip of conductive material, such as a metal, formed into two turns of a helix-like curve. Dielectric layer (320) is a thin-film dielectric layer that is located between the two turns of helical ring (310). In this embodiment, the main axis of helical ring (310) (and the axis about which helical ring (310) is substantially symmetric) is substantially parallel to the normal to the large-area surfaces of dielectric layer (320). It should be apparent to the person of ordinary skill in the art that the disclosure of this specification includes embodiments in which helical ring (310) includes a non-integer number of turns; for example, helical ring (310) may include two full turns as depicted (where the term "full turn" denotes a closed turn or a turn that is nearly closed apart from a negligibly small gap region), and then additional conductive material forming a length less than a full turn on helical ring (310). For purposes of this specification, such an embodiment is considered to disclose a three-turn helical ring.

More generally, an embodiment in which helical ring 310 includes n full turns and additional conductive material forming a length less than a full turn on helical ring 310 (i.e., a partial turn) may be considered to be a n+1-turn helical ring, where n is an integer. Accordingly, the term "turn" covers not only a full turn of helical ring 310, but also a case where less than a full turn (but more than a negligible amount of conductive material) is referenced in helical ring 310 (i.e., a partial turn). In determining the number of turns of a helical ring in embodiments and sub-embodiments of the present invention, one may count full turns from one end of the helical ring and obtain a value of m, where m is an integer. Assuming the helical ring includes additional conductive material forming a length less than a full turn of the helical ring, then the helical ring would be considered to have m+1 turns.

Figure 4:
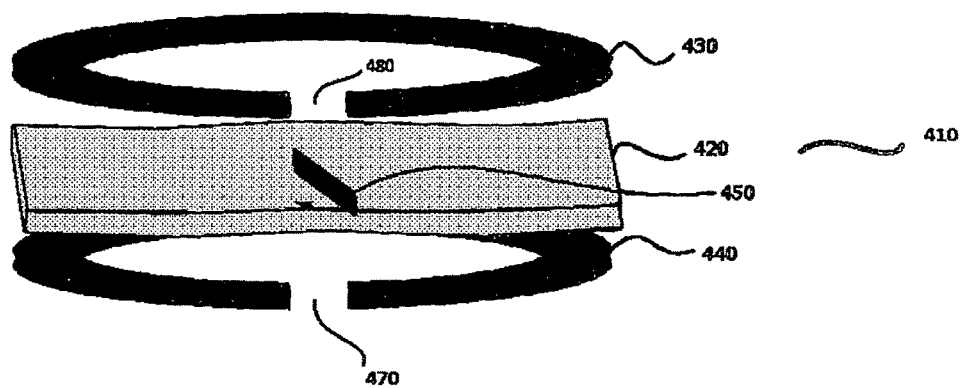
FIG. 4 depicts an embodiment of a helical resonator (410) that comprises helical rings with aligned gaps, wherein adjacent helical rings are connected by a via metallization piece (450), in accordance with the present invention.

In one subembodiment, helical ring (310) may comprise a helix that has two turns. In another subembodiment, whose components are depicted in FIG. 4 in unassembled form, helical ring (410) comprises first ring (430), second ring (440), and via metallization (450), which connects first ring (430) and second ring (440). In this sub-embodiment, each of first ring (430) and second ring (440) include a gap region, respectively gap (480) and (470), and first ring (430) and second ring (440) are coaxially placed so that the respective axes of symmetry (or main axes) of the circles substantially formed by each of first ring (430) and second ring (440) are substantially collinear. In the sub-embodiment depicted in FIG. 4, via metallization (450) conductively connects first ring (430) and second ring (440) across the spacing formed between first ring (430) and second ring (440). Additionally, thin-film dielectric layer (420) is located between first ring (430) and second ring (440), and, as depicted, the normal to the large-area surfaces of thin-film dielectric layer (420) are substantially parallel to the main axes of first ring (430) and second ring (440). For purposes of this disclosure, a sub-embodiment of a resonator formed from two separate rings connected by a via metallization in this way is also considered to be a two-turn helical ring resonator. FIG. 3 also depicts the sub-embodiment of FIG. 4 in assembled form.

As will be obvious to one of ordinary skill in the art based on the current disclosure, a helical resonator in embodiments of the invention may comprise an assembly of separate parts (e.g., separate rings and via metallization elements that are connected to one another) or may be formed from a single piece (e.g., a single-formed helical ring). Similarly, a dielectric layer used in embodiments of the invention may comprise a single-formed dielectric layer, or sections of dielectric layers, that considered as a whole, form a layer of dielectric material.

Unlike devices of the prior art, in embodiments and subembodiments of the present invention, the inductive element (for example, a solenoid or coil) also forms a capacitor. For example, in embodiments and subembodiments similar or analogous to the those depicted in FIGS. 3 and 4, the turns of the helical ring have a non-negligible finite width in planes substantially perpendicular to the main axis of the helical ring. Thus, sections of adjacent turns of the helical ring that are aligned in directions parallel to the main axis of the helical ring are structurally similar to a parallel plate capacitor. Thus, such a section of the helical ring, in addition to possessing a non-negligible inductance $\Delta L$, also corresponds to a non-negligible capacitance $\Delta C$. In this manner, the resonator in embodiments and sub-embodiments of the present invention contains distributed elements (e.g., a distributed capacitor and inductor), instead of lumped elements (e.g., a lumped capacitor and a lumped inductor). Because of this feature, adjacent turns of the helical ring are non-negligibly capacitively coupled to one another. Such capacitive coupling is increased by including a thin-film dielectric layer between one or more adjacent turns of the helical ring (i.e., in a configuration in which the normal to the large-surface area surface of the thin-film dielectric layer is substantially parallel to the main axis of the helical ring, as depicted, for example, in FIGS. 3 and 4.) The non-negligible capacitive coupling of sections of adjacent turns that are aligned in directions substantially parallel to the main axis of the helical resonator (including sections of full and/or partial turns that are so aligned) are in contrast to previously known resonators which have included solenoids and coils made of conductive wire (and not having non-negligible width and/or height as discussed above) that do not have non-negligible capacitive coupling between sections of adjacent turns that are so aligned.

In operation, the resonator (such as helical ring 310 and/or helical ring 410) may be placed in close proximity to the target that is desired to be imaged. When a radio frequency (RF) magnetic field is applied to that object in accordance with the MRI technique, this time-varying magnetic field induces a time-varying current in the resonator in accordance with Faraday's law. This induced current in the resonator, in turn, generates a magnetic field in its vicinity in accordance with the displacement current term in Ampere's law. Thus, in the vicinity of the resonator, the intensity of the time-varying magnetic field that is applied by the MRI device is amplified compared to the situation in which the resonator is not present in proximity to the target.

In embodiments of the invention, the geometry of the resonator, including the thin-film dielectric layer, confines the electric field that forms as a result of the charge carriers that comprise the induced current in the resonator to the region between the rings or turns of the resonator, and does so substantially homogenously across the dimensional extent of the resonator. Because tissue heating caused by previously known resonators is due to significant presence of the corresponding electric field outside the dimensional extent of such previously known resonators, the resonators in embodiments of the current invention generally reduce heating of tissue in the region surrounding the resonator compared to previously known resonators.

Cells and tissues of live organisms include ionic molecules such as potassium (K), calcium (Ca), sodium (Na) and iron (Fe), which makes such cells and tissues electrically conductive. As will be known to one of ordinary skill in the art, electrically conductive media are generally not suitable for the propagation of electromagnetic waves due to absorption of electromagnetic energy by such electrically conductive media. For a given electric field intensity E, the conduction current density J in tissue exposed to the electric field E, is given by Equation 4.

$$J = \sigma E \qquad \text{Equation 4}$$

where $\sigma$ is the conductivity of the tissue exposed to the electric field. The generation of conduction current density J causes heating of the tissue through which the current passes; the amount of such heating is proportional to $|J|^2$. Because the energy that is used in such heating is lost from a resonator that generates the electric field, the quality of the resonator is effectively decreased. Additionally, the current density generated in tissue surrounding a resonator due to leakage of the electric field outside the resonator and into the surrounding tissue may disturb the nuclear spin distribution of the surrounding tissue, which may generate distortions and artifacts in MR images that are taken in the vicinity of the resonator.

Figure 2:
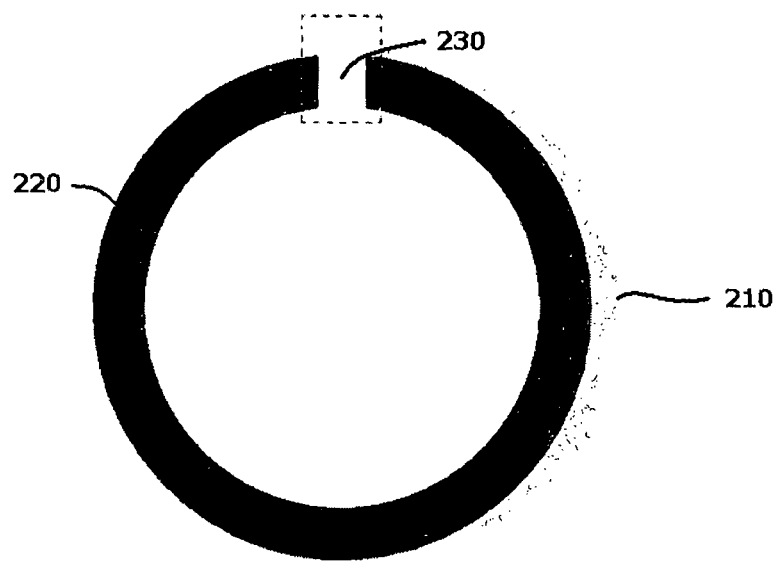
FIG. 2 depicts a previously known split-ring resonator.

One common technique to alleviate such problems is to isolate the capacitive regions of the resonator using a dielectric material. This leads to both decreased energy loss from the resonator into surrounding tissue and a higher Q-factor for the resonator (e.g., due to effective decrease of resistance R in Equation 3 when considering both the resonator and the surrounding tissue as part of the resonator system). This technique is commonly used in both classical split-ring resonator (SRR) structures (as depicted in FIG. 2) and capacitively loaded ring (RLC) structures (for example, a modification of the SRR of FIG. 2 in which a lumped capacitor element is added in parallel across gap 230). However, in both cases, the addition of a dielectric material for isolation purposes increases the thickness of the device, rendering it more difficult to safely implant such devices into the patient's body.

A better solution to overcome such problems is to isolate the electric field generated by the resonator from the surrounding lossy tissue by substantially confining the electric field to dielectric material that is placed within the capacitive structures of the resonator. The conductive paths of embodiments of a helical resonator of this disclosure (i.e., the helical rings) are structured so that the electric field generated by the resonator is substantially confined within the capacitors that are effectively formed by sections of adjacent turns of the helical resonator that are aligned along the main axis of the helical resonator. The presence of a dielectric layer between the sections of adjacent turns further isolates the electric field from tissue surrounding the resonator. It has been surprisingly found that the use of a via metallization element to connect adjacent turns or rings of a helical resonator (for example, the embodiment of FIG. 4 discussed above) achieves a higher non-resistive impedance and thus Q-factor value compared to a resonator in which adjacent turns or rings are not connected (for example, the embodiment of FIG. 2E of U.S. 2010/0127707, which is discussed further below in Example 3 of the present disclosure). In particular, for the same resonance frequency, an embodiment of the present invention achieves four times the non-resistive impedance of a comparable classical SRR resonator with only two times higher resistivity due to the additional length of the conductive path of the embodiment of the present invention. Thus, a two-turn embodiment of the helical resonator of the present disclosure doubles the Q-factor value, whereas a three-turn embodiment triples the Q-factor value that can be achieved compared to comparable embodiments of a SRR resonator. Based on the current disclosure, one of ordinary skill in the art may implement embodiments that provide different gains of Q-factor value compared to comparable SRR resonators. Example 3 that is set forth further below in this disclosure discusses these surprising benefits in more detail.

In embodiments that include a partial turn in addition to at least one full turn, the gaps of the partial turn and the adjacent full turn may be considered to be aligned when at least one of the ends of the gaps of the adjacent full turn is substantially aligned with at least one of the ends of the gap of the partial turn, for example, along a direction substantially parallel to the main axes of the adjacent full turn.

Figure 5:
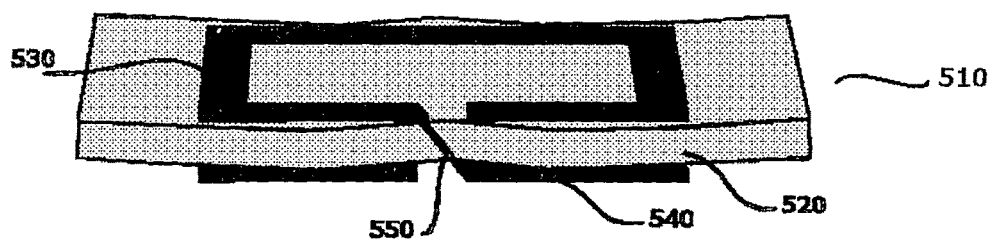
FIG. 5 depicts a helical ring resonator (510), which has a square cross-section, in accordance with the present invention.
Figure 6:
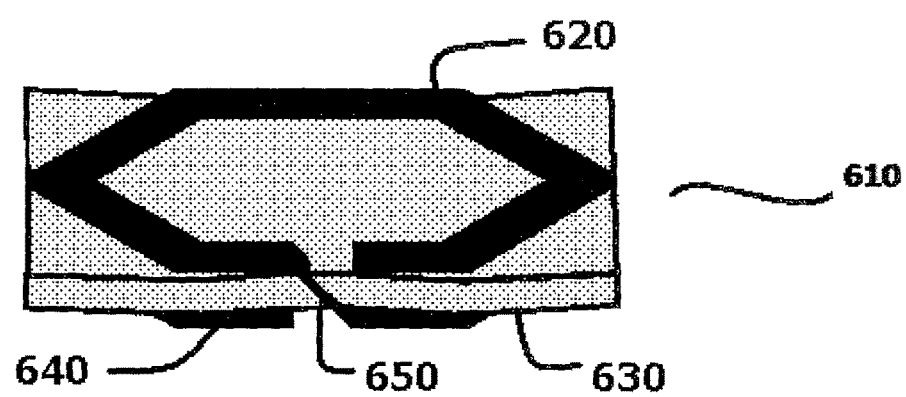
FIG. 6 depicts a helical ring resonator (610), which has a hexagonal cross-section, in accordance with the present invention.
Figure 27:
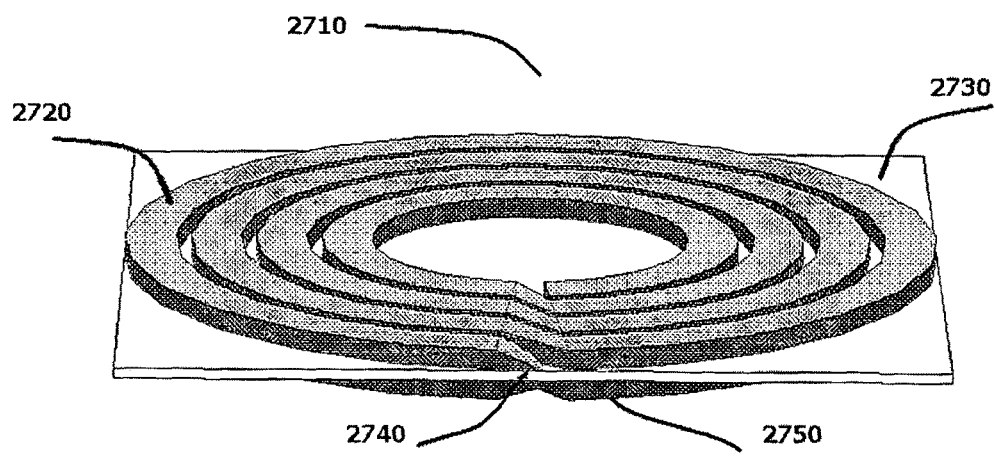
FIG. 27 depicts a helical resonator (2710), which can be composed of multi-turn split ring resonators (2720 and 2750) connected with a metal (2740).

Embodiments of a helical resonator may include more complex geometries in which one or more of the turns forming a conductive path do not comprise a curved and planar cross section (for example, as depicted in FIGS. 3 and 4). For example, each turn may instead comprise a wire that has been curled into a planar, spiral configuration, such as depicted in FIG. 27 (depicting a helical resonator (2710) that includes a top ring (2720), and bottom ring (2750) connected by via metallization (2740), and that also includes thin-film dielectric layer (2730) sandwiched between the two rings). In such a configuration, the gaps of adjacent turns may be aligned as depicted in FIG. 27, with via metallization (2740) connecting the adjacent turns. In such embodiments, adjacent turns are, once-again, capacitively coupled to one another. Other embodiments of the invention include resonators that are formed from multi-turn helical rings that have cross sections that form different geometric shapes, such as polygonal shapes including triangles, squares and rectangles. For example, FIG. 5 depicts a two-turn helical ring (510) comprising a square cross-section, whereas FIG. 6 depicts a two-turn helical ring (610) comprising a hexagonal cross-section. In a sub-embodiment of FIG. 5, the resonator may be formed from two square-shaped conductive elements, for example, first square-shaped conductive element (530) and second square-shaped conductive element (540), that each includes a gap, with the square-shaped conductive elements placed so that they are substantially aligned along their main axes, and their gaps are aligned with respect to each other. In such a sub-embodiment, metalized via (550) conductively connects the square-shaped conductive elements across the spacing formed between them. Similarly, an analogous sub-embodiment of the embodiment of FIG. 6 exists in which two hexagonal conductive elements, each having a gap, are placed in alignment as depicted in FIG. 6, with a metallization via (650) connecting the two hexagonal conductive elements across the spacing formed between them. In each of the embodiments and sub-embodiments depicted in FIGS. 5 and 6, a thin-film dielectric layer is formed between conductive elements as depicted in FIGS. 5 and 6. Once again, in these embodiments and sub-embodiments, the connections between the turns of the helical ring (such as the connections formed by the via metallization of the sub-embodiments) result in high values of inductance and capacitance for the corresponding resonators. For purposes of this disclosure, a sub-embodiment of a resonator formed from two separate semi-circular or polygonal-shaped conductive elements (with each conductive element containing a gap) connected by a via metallization may be considered to be a two-turn helical resonator.

Figure 7:
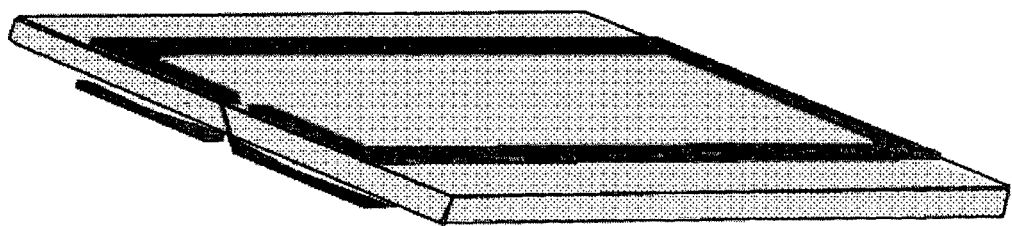
FIG. 7 depicts a helical ring resonator (710), which has a rectangular cross-section, in accordance with the present invention.

FIG. 7 depicts another embodiment of a resonator in which the conductive elements are elongated in one dimension; thus cross sections along the main axis of the resonator are rectangular.

Figure 8:
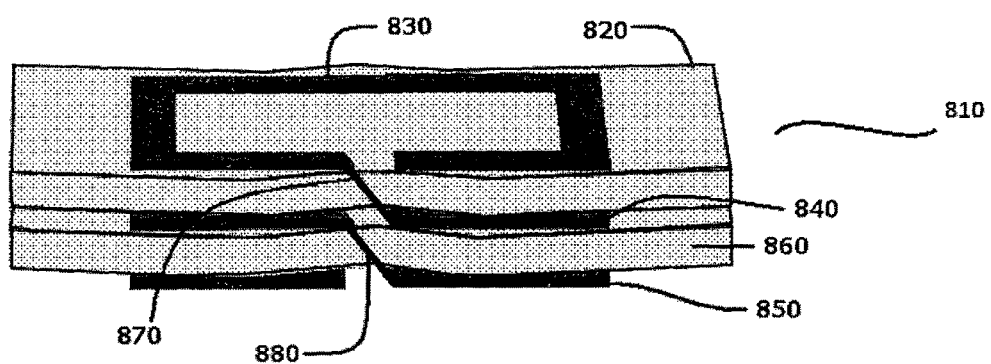
FIG. 8 depicts a three-layer helical ring resonator (810), which has a square cross-section, in accordance with the present invention.

There are many other embodiments in accordance with the current disclosure, which will be apparent to the person of ordinary skill in the art based on this disclosure. For example, FIG. 8 depicts a three-layer embodiment of the resonator (810). In one sub-embodiment, the three-layer resonator comprises a helical ring that has three turns, with a thin-film dielectric layer placed between consecutive turns of the resonator. In the sub-embodiment depicted in FIG. 8, three square-shaped conductive elements, for example, square-shaped conductive elements (830), (840) and (850), are placed so that they are substantially aligned along their main axes, and their gaps are aligned with respect to each other. Additionally, via metallization (870) conductively connects first square-shaped conductive element (830) and second square-shaped conductive element (840) across the spacing formed between first square-shaped conductive element (830) and second square-shaped conductive element (840). Similarly, via metallization (880) conductively connects second square-shaped conductive element (840) and third square-shaped conductive element (850) across the spacing formed between second square-shaped conductive element (840) and third square-shaped conductive element (850). Additionally, first dielectric layer (820) is located between first square-shaped conductive element (830) and second square-shaped conductive element (840), and, as depicted, the normal to the large-area surfaces of first dielectric layer (820) are substantially parallel to the main axes of first square-shaped conductive element (830) and second square-shaped conductive element (840). Similarly, second dielectric layer (860) is located between second square-shaped conductive element (840) and third square-shaped conductive element (850), and, as depicted, the normal to the large-area surfaces of second dielectric layer (860) are substantially parallel to the main axes of second square-shaped conductive element (840) and third square-shaped conductive element (850). For purposes of this disclosure, a subembodiment of a resonator formed from n separate semi-circular or polygonal-shaped conductive elements (with each conductive element containing a gap, and n designating an integer), with adjacent conductive elements connected by a via metallization, may be considered to be a n-turn helical resonator.

Figure 17:
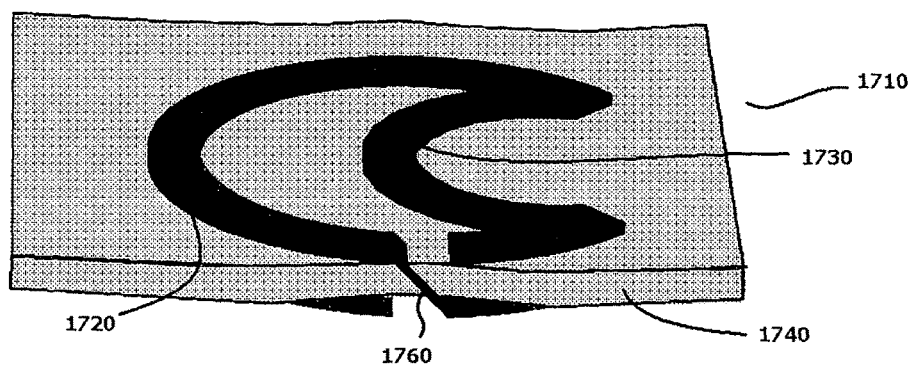
FIG. 17 depicts a helical resonator embodiment (1710) of the present invention in which the cross-sections of the resonator is of a non-semicircular and non-polygonal shape.

In embodiments of the present invention, an example of which is illustrated in FIG. 17, the rings of the helical resonator (for example ring 1720 and ring 1730 of helical resonator 1710 of FIG. 17) have an arbitrary cross-sectional shape that is neither polygonal nor semi-circular. A via metallization (such as via metallization element 1760 of FIG. 17) may connect adjacent turns or rings of such a helical resonator. A dielectric layer (such as dielectric layer 1740 of FIG. 17) may be inserted between adjacent turns or rings to increase the capacitance (and decrease the resonant frequency) of such embodiments of a helical resonator, similar to the embodiments discussed earlier.

Generally, speaking, the greater the number of turns in a helical resonator, the greater the value of the inductance of the resonator. Similarly, placement of a thin-film dielectric layer between each of the consecutive turns of the helical resonator leads to a greater value for the capacitance of the helical resonator in comparison to a similar helical resonator containing fewer turns and fewer thin-film dielectric layers. Thus, it will be apparent to one of ordinary skill in the art based on the disclosure of this specification that by adjusting the number of turns and the number of thin-film dielectric layers between adjacent turns, each of the inductance and capacitance values of the helical resonator may be adjusted, and that the resonance frequency of the helical resonator may be selected in accordance with the adjusted values for the inductance and capacitance and Equation 2.

Based on the current disclosure, one of ordinary skill in the art may pick lower or higher values of the resonance frequency of helical resonator by picking higher values of L and C or lower values, in accordance with equations 2 and 3. For a two-turn square-shaped helical resonator that has a side-length of one cm the inductance (L) would be approximately $80 \times 10^{-9}$ Henries, which requires an effective capacitance (C) of approximately $20 \times 10^{-12}$ Farads to achieve a resonance frequency of approximately 125 MHz. To obtain this capacitance, one can adjust the thickness of the dielectric layer by considering its relative electric permittivity ($\varepsilon_r$) and the width of the conductive lines forming the rings. For a one mm-wide conducting line and a relative permittivity ($\varepsilon_r$) of five for the dielectric material of the dielectric layer, the dielectric thicknesses would be approximately 10 μm and 25 μm, for a two-turn and three-turn helical resonator, respectively. Decreasing the outer dimensions of a helical resonator in accordance with the current disclosure would lead to a decreased inductance (L) value, which would require an increased capacitance (C) value to maintain the selected resonance frequency. Embodiments of the present invention permit achieving such higher capacitance (C) values, resulting in outer dimension sizes for helical resonators in accordance with this disclosure as low as 2 mm and a resonance frequency of around 125 MHz using. Generally, sub-centimeter size helical resonators are better suited for implantation into a patient. For example, smaller helical resonators would leave more room in an implant for other elements such as markers, sensors, actuators and connectors in wired applications.

Figure 26:
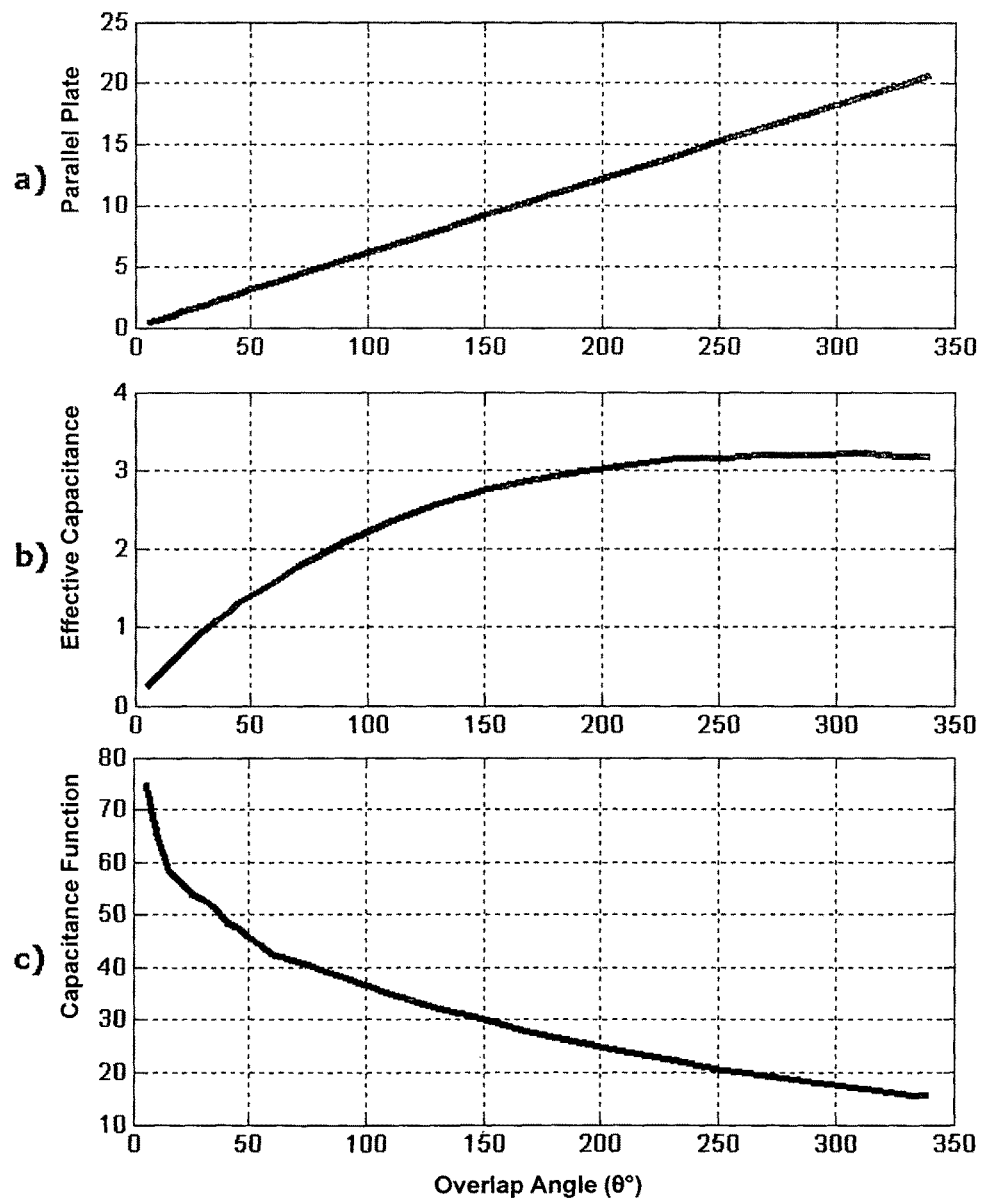
FIG. 26 depicts the graphs of the parallel capacitance value, a, the effective capacitance value, b, and the capacitance function as a function of increasing overlap angle, c, of a two-turn circular helical resonator.

FIG. 26 depicts aspects of embodiments of the present invention that illustrate the superiority of such embodiments to previously proposed structures. For a two-turn circular helical resonator (for example, such as the two-turn helical resonator depicted in FIG. 3), the parallel plate capacitance between the upper and lower rings may be calculated in accordance with Equation 5.

$$C_{paralel\ plaka} = \varepsilon_r \varepsilon_0 \frac{w(r-0.5w)}{t_{dielektrik}} \theta \qquad \text{Denklem 5}$$

Here, w is the width of the conducting lines comprising the turns along planes substantially perpendicular to the main axis of the helical ring, r is the radius of the turns, and θ is the angle that measures the overlap (along directions that are substantially parallel to the main axis of the helical ring) of the first and second turns of the two-turn circular helical resonator. In accordance with standard polar coordinates, the value of θ ranges between 0 to 2π, with the boundary values of 0 and 2π corresponding to complete overlap. The value of the overlap angle θ may be chosen to have an appropriate value for purposes of fine tuning the resonance frequency FIG. 26 depicts the capacitance values of a two-turn circular helical resonator as a function of θ in which the circular turns each have a radius of 4 mm, the conductive line has a width of 1 mm (along planes substantially perpendicular to the main axis of the circular helical resonator), the thickness of the dielectric layer is 10 μm, and the relative permittivity has a value of 5. In particular, FIG. 26*a* depicts the parallel plate capacitance of the two-turn helical resonator as a function of θ. FIG. 26*b* depicts the effective capacitance of the two-turn helical resonator as a function of θ, and FIG. 26*c* depicts the capacitance function of the two-turn helical resonator as a function of θ, where the capacitance function is defined as the ratio of effective capacitance to parallel plate capacitance. Although the parallel plate capacitance increases linearly with the increase of θ, the rate of increase of the effective capacitance Decreases with increasing θ. Based on the figures of FIG. 26, the person of ordinary skill in the art may determine an overlap angle that is required to obtain a desired value of effective capacitance, which in turn may be calculated based on a desired value of the resonance frequency and Equation 2. For example, to obtain a 3 pF effective capacitance for the two-turn circular helical resonator, an overlap angle of 200°, instead of 50°, should be used given the parameter values taken in this example. Based on FIG. 26*c*, it will also be clear to the person of ordinary skill in the art that a value of 4 pF cannot be obtained given these chosen parameter values. Based on the current disclosure and discussion of the applicable considerations, one of ordinary skill in the art may change the parameter values (corresponding to changes of physical dimensions of the device) to obtain desired values of effective capacitance for different geometries of a helical resonator. In particular, based on this disclosure and discussion of considerations, the person of ordinary skill in the art may design devices with different physical dimensions that yield the same resonance frequency.

Composition and Method of Manufacture:

The conductive lines of helical resonators in accordance with the current disclosure preferably have an electrical conductivity greater than $3 \times 10^7$ siemens/meter, a thickness in the range from 10 nanometer to 1 millimeter, and may be a metal or metal alloy. Examples of such metals and metal alloys include, but are not limited to, platinum, gold, titanium, silver, aluminum, chromium, niobium, and memory metals alloys such as Nitinol, titanium-palladium-nickel, nickel-titanium-copper, gold-cadmium, iron-zinc-copper-aluminum, titanium-niobium-aluminum, hafnium-titanium-nickel, iron-manganese-silicon, nickel-titanium, nickel-iron-zinc-aluminum, copper-aluminum-iron, titanium-niobium, zirconium-copper-zinc, and nickel-zirconium-titanium. Other metals and metal alloys are also possible, but gold, platinum, palladium, indium, osmium, rhodium, titanium, tantalum, tungsten and ruthenium are preferred due to their biostability. Gold, platinum, titanium and their alloys are further preferred due to their long-term biocompatibility.

As discussed above, a helical resonator in accordance with the current disclosure may also include dielectric layer(s) positioned between adjacent turns or rings of the helical resonator. Such dielectric layers provide electrical insulation, structural support, and structural spacing to adjust the effective capacitance between aligned sections of adjacent turns or rings of the helical resonator. In certain embodiments, the dielectric layers may have a relative permittivity in the range from 1.1 to 5000, a thickness in the range of 1 nanometer to 1 millimeter, and may be comprised of one or more of aluminum nitride, barium titanate, tantalum oxide, aluminum oxide, ceramics—typically alumina or aluminosilicates, glasses—typically borosilicate, polyesters, polyamides, $SiO_2$, $Si_3N_4$, $Al_2O_3$, $Y_2O_3$, $La_2O_3$, $Ta_2O_5$, $TiO_2$, $HfO_2$, $ZrO_2$, as well as composite mixes composed of dielectric materials, preferably silicon-nitride ($Si_3N_4$) due to its biocompatibility. A dielectric layer may also be comprised of polymeric materials. Examples of suitable polymers include, but are not limited to, ceramic, polystyrene;

polyisobutylene copolymers and styrene-isobutylene-styrene block copolymers such as styrene-isobutylene-styrene tert-block copolymers (SIBS); polyvinylpyrrolidone including cross linked polyvinylpyrrolidone; polyvinyl alcohols, copolymers of vinyl monomers such as EVA; polyvinyl ethers; polyvinyl aromatics; polyethylene oxides; polyesters; polyalkylenes including polypropylene, polyethylene, polyurethanes, polycarbonates, silicones; siloxane polymers; cellulosic polymers; polymer dispersion such as polyurethane dispersions (BAYHDROL); squalene emulsions; and mixtures and copolymers of any of the foregoing.

Figure 18:
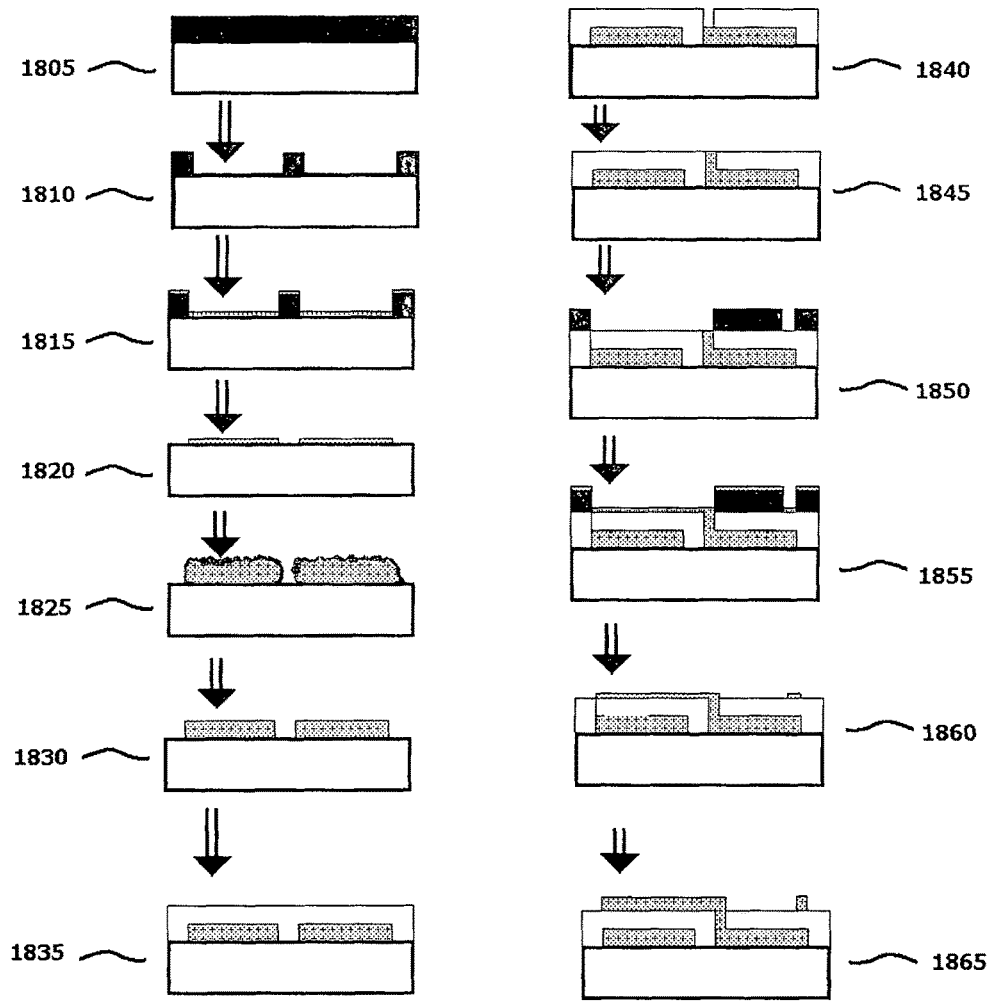
FIG. 18 depicts a first example method of manufacture of helical resonators in accordance with the current disclosure.

An example micro-fabrication procedure for a two layer helical resonator in accordance with the current disclosure is summarized in FIG. 18. In this example, the metal used is a Ti/Gold alloy due to its biocompatibility. In this example, a substrate is used for purposes of ease of fabrication, although helical resonators may be manufactured without the use of a substrate in other embodiments of the invention. In this example, the substrate may comprise one or more materials selected from, but not limited to, silicone, quartz, glass, oxides of silicone, pyrex, FR-4 and any other material that is suitable for microfabrication methods and printed circuit board (PCB) manufacturing.

In step 1805, the substrate is coated with a material called a photoresist. In step 1810, the structure of the conductive lines forming the helical ring is created using UV lithography. In step 1815, the conducting lines (Ti/Au alloy in this example) are formed using thermal evaporation, but this procedure can be performed by any other method known in the art, such as sputtering, molding, micro-molding, and conductive ink painting. In step 1820, the photoresist is lifted off the substrate to obtain the first ring or turn of the helical resonator, which is similar to SRR 210 of FIG. 2, and the remaining structure is thermally annealed (RTA) for mechanical stability. In step 1825, the conductivity of the ring may be increased by increasing its thickness by electroplating or any other method such as electrodeless coating or molding. In step 1830, the ring is polished to eliminate or minimize the impact of any defects, cracks or protrusions on its top side. In step 1835, the dielectric layer may be formed using known micro-fabrication methods. Such micro-fabrication methods may include, but are not limited to, physical vapor deposition (PVD) techniques such as sputtering, thermal evaporation, vapor deposition, and chemical vapor deposition techniques; chemical vapor deposition (CVD); plasma enhanced chemical vapor deposition; atomic layer deposition (ALD); electron-beam coating, and wet coating methods such as spinning, drop casting, electrodeless dielectric coating and others. In step 1840, an opening for the via metallization may be made in the dielectric layer by using known methods, including milling, wet etching by using chemical or reactive ion etching (RIE). In step 1845, the opening for the via metallization element is filled with a conductive material to create the via metallization element. Gold may be preferably used for this purpose due to its biocompatibility and to achieve higher value for the inductance. Fabrication of a second turn or ring of the helical resonator in this example is substantially identical to the manufacturing method of the first turn or ring as just discussed; thus, the method of manufacture of this example is a layer-by-layer (LbL) microfabrication process. Step 1850 comprises lithography of the photoresist; step 1855 comprises a metal coating step; step 1860 comprises a step of removal or lift-off of the photoresist; step 1865 comprises a step of thickening the top layer using electroplating.

Figure 19:
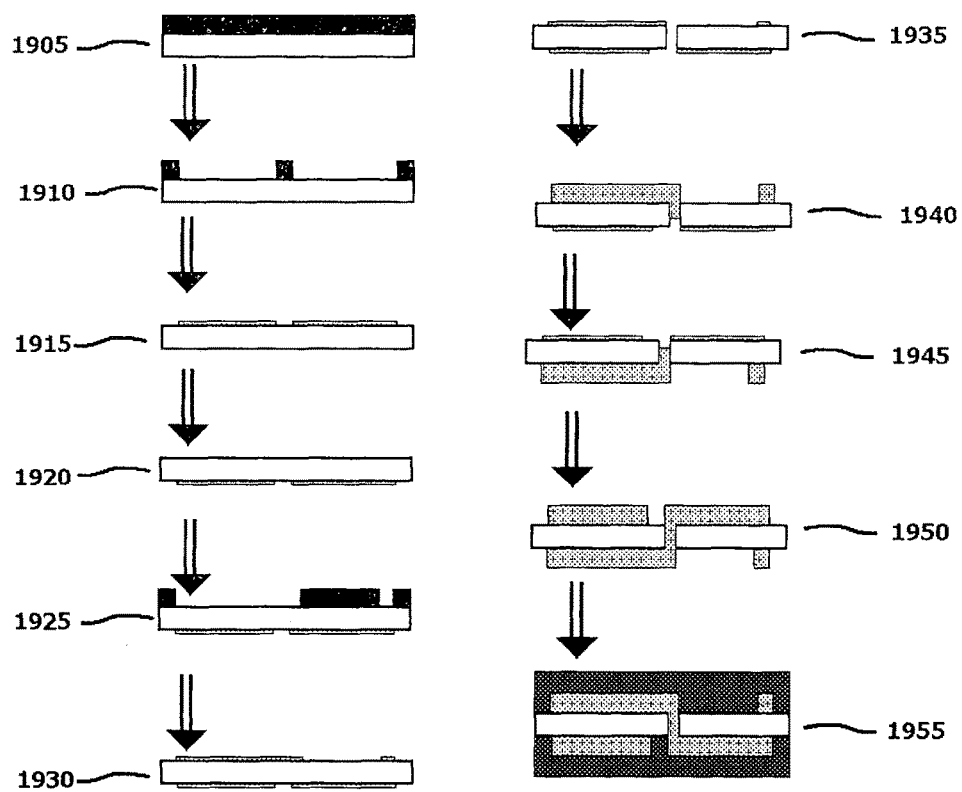
FIG. 19 depicts a second example method of manufacture of helical resonators in accordance with the current disclosure.

FIG. 19 depicts another example method that may be used to manufacture helical resonators in accordance with the current disclosure. This example method is particularly suitable for the manufacture of a flexible helical resonator that has a mechanically strong dielectric layer. The dielectric layer may be selected from any of the dielectric materials discussed earlier or otherwise known to the person of ordinary skill in the art. For example, a polyimide dielectric film, such as KAPTON®, of 20 μm thickness may be used. In this example, the conducting lines forming the turns or rings of the helical resonator are also made from a Ti/Au because of the biocompatibility of that material. The fabrication process in this example is similar to that of the previous example. In step 1905, the dielectric film is coated by a photoresist. In step 1910, the photoresist is patterned by using classical ultraviolet (UV) lithography techniques. In step 1915, the polyimide film is coated with Ti/Au alloy by using either thermal evaporation or any other method known to those of ordinary skill in the art. In this example process, and differently from the previously discussed example process, in step 1920, the film is turned upside down to fabricate another helical ring on the other side. The same procedure as just discussed for the first side is repeated in steps 1925 and 1930. In step 1935, an opening for the via metallization element is drilled by using milling, and the structure is thermally annealed (RTA) to provide mechanical stability, but other methods as known to those of skill in the art may be used. The via metallization element is created during a process of thickening the helical rings, which includes thickening the top layer (step 1940), turning the device over (step 1945) and thickening the new top layer (step 1950). In step 1955, the device is coated with a polydimethylsiloxane (PDMS) layer to provide mechanical stability. The dimensions of the device manufactured in this example was 2 cm by 2 cm, with a the conductive line width of 1 mm and thickness of 20 μm. The dielectric polyimide film had a relative permittivity of 2.3 and a thickness of 20 μm. This device was designed to resonate at 123 MHz, for an MRI device that achieved a static magnetic field of 2.89 Tesla.

Figure 22:
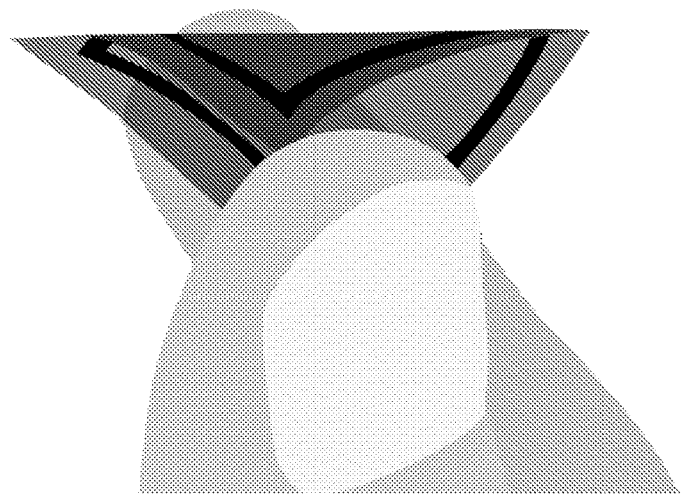
FIG. 22 depicts the size and flexibility of a helical resonator manufactured in accordance with an example method of manufacture of this disclosure.
Figure 23:
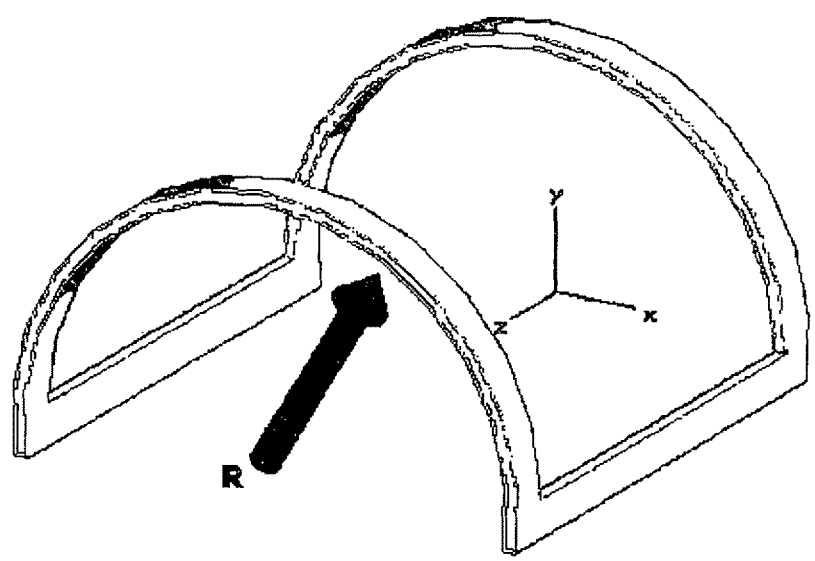
FIG. 23 depicts a schematic view of the bending of the helical resonator of FIG. 22.
Figure 24:
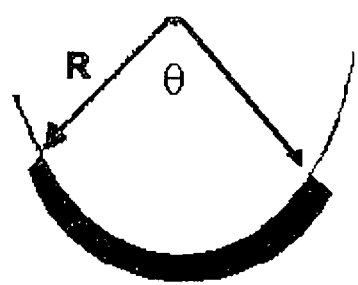
FIG. 24 depicts another schematic view of the bending of the helical resonator of FIG. 22.
Figure 25:
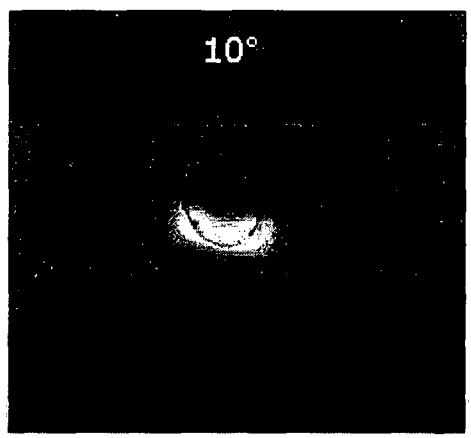
FIG. 25 depicts an MR image of the helical resonator of FIG. 22.

FIGS. 22-25 depict images and schematic views of a helical resonator manufactured in accordance with the above example method. FIG. 22 depicts the size and flexibility of such a helical resonator. FIG. 23 provides a schematic view of the bending of such a helical resonator. FIG. 24 provides another schematic view; here R had a value of 12 mm and the angle θ had a value of 0.584π for the relevant helical resonator. FIG. 25 provides an MR image of the relevant helical resonator.

EXAMPLES

Figure 9:
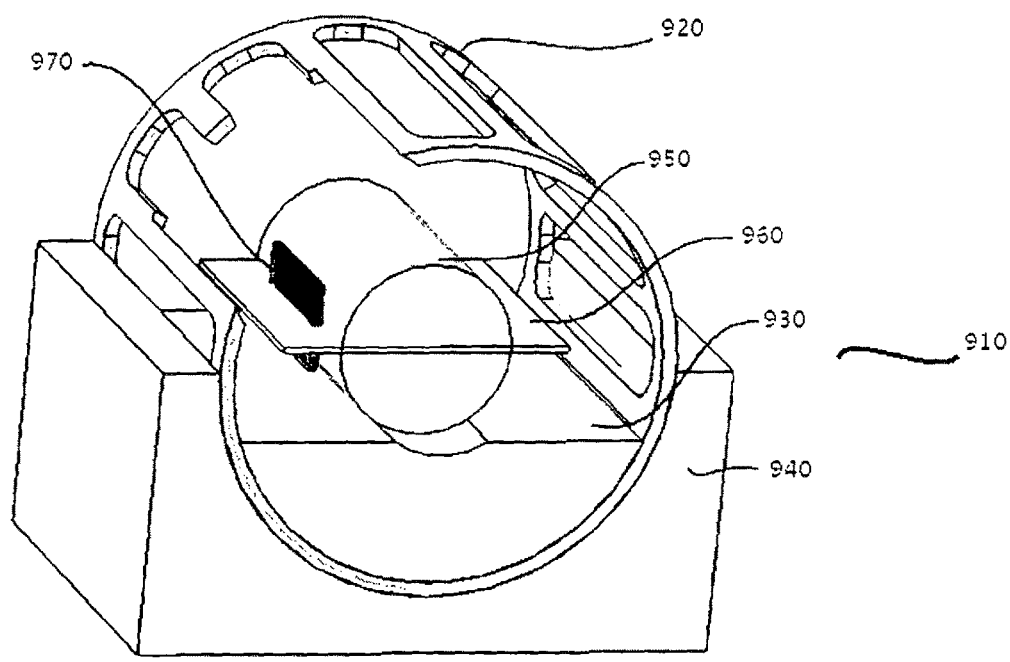
FIG. 9 depicts a testing setup (910) used to model ex vivo and in vivo behavior of a MRI image enhancement device comprising a helical resonator in accordance with an embodiment of this invention. The helical resonator (970) depicted in FIG. 9 is placed and used as an ex vivo device.

Example 1: Testing of an Embodiment of the Invention as an Ex Vivo MRI Image Enhancement Device FIG. 9 depicts a testing setup used to model ex vivo and in vivo behavior of a MRI image enhancement device comprising a helical resonator in accordance with an embodiment of this invention. The parts of MRI device 910 depicted in FIG. 9 include RF coil (920) for applying a RF magnetic field in accordance with the MR imaging technique, and supporting pad (930) and patient table (940) for supporting a patient whose MR images may be taken. In the testing setup of this example, a head coil was selected as RF coil (920), because head coils are one of the most frequently used type of coils in MRI devices. More generally, however, any other type of surface coils ordinarily used in MRI devices may also be used. In the testing setup depicted in FIG. 9, supporting pad (930) is a foam pad typically used in certain medical devices to support the head of a patient. In the testing setup, supporting pad (930) was used to support the human body-mimicking phantom (950) near the center of RF coil (920). Patient table (940) is the platform upon which the subject lies down, and which is moved near the center of MRI device (910) prior to imaging. Patient table (940) additionally is configured to permit a surface coil, such as RF coil (920), to be attached to patient table (940).

Phantom (950) is a bottle of a mixture of de-ionized water solution, which mimics the electromagnetic properties of a human or animal body. The solution in phantom (950) additionally includes the salt copper (II) sulfate pentahydrate (i.e., $Cu(II)SO_4.5H_2O$), which decreases the relaxation time of water subjected to the static and RF magnetic fields of the MRI device, and salt (i.e., NaCl) to increase the conductivity of the phantom. Because different human or animal tissues exhibit different electromagnetic properties, the constituents of phantom (950) may be varied depending on the tissue that is being modeled.

Imaging slice (960) is the slice of the phantom that was imaged in this example. In this example, 2-D images were obtained as indicated by the geometry of imaging slice (960). Currently, this is the most widely used imaging configuration for MRI devices, and the resulting slice selection is known as a "coronal" slice selection. As will be apparent to one of ordinary skill in the art based on the disclosure in this specification, other imaging configurations could also be used in the testing setup depicted in FIG. 9.

Resonator (970) is a helical resonator in accordance with the embodiments discussed earlier, and is the device that was tested in the testing setup depicted in FIG. 9. More specifically, resonator (970) as used in this example was a two-turn, rectangular resonator with an outer dimension of approximately two centimeters. The width of the conductive path of the resonator was approximately one millimeter. The thickness of the dielectric layer of the resonator was approximately 20 μm, and the dielectric layer had a relative permittivity of 2.3. As depicted in FIG. 9, resonator (970) is located in contact with but external to phantom (950); thus, the testing setup depicted in FIG. 9 models the behavior of resonator (970) as an ex vivo MR image enhancement device.

Figure 10:
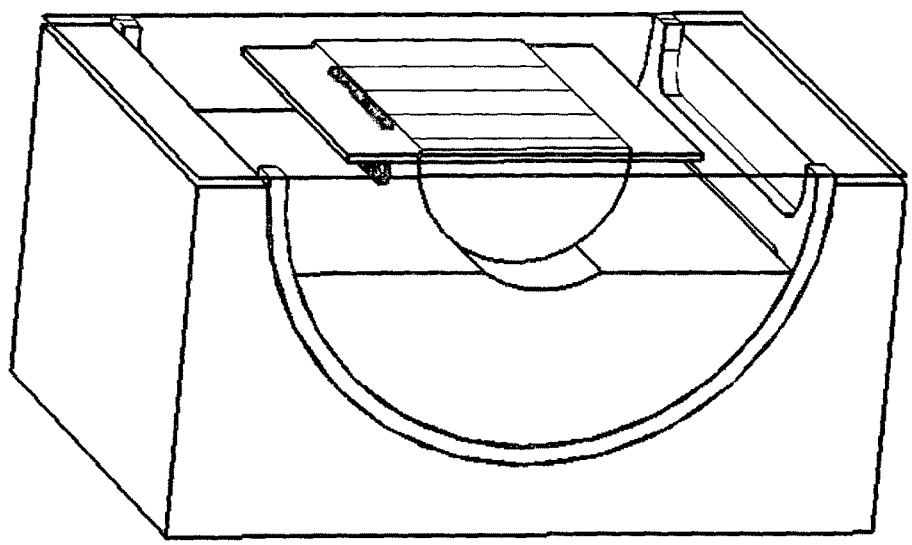
FIG. 10 depicts the cross-section (960) of the phantom (950) that was imaged by the MRI device and the resonator of the embodiment of FIG. 9, wherein the helical resonator (970) was used as an ex vivo device.
Figure 11:
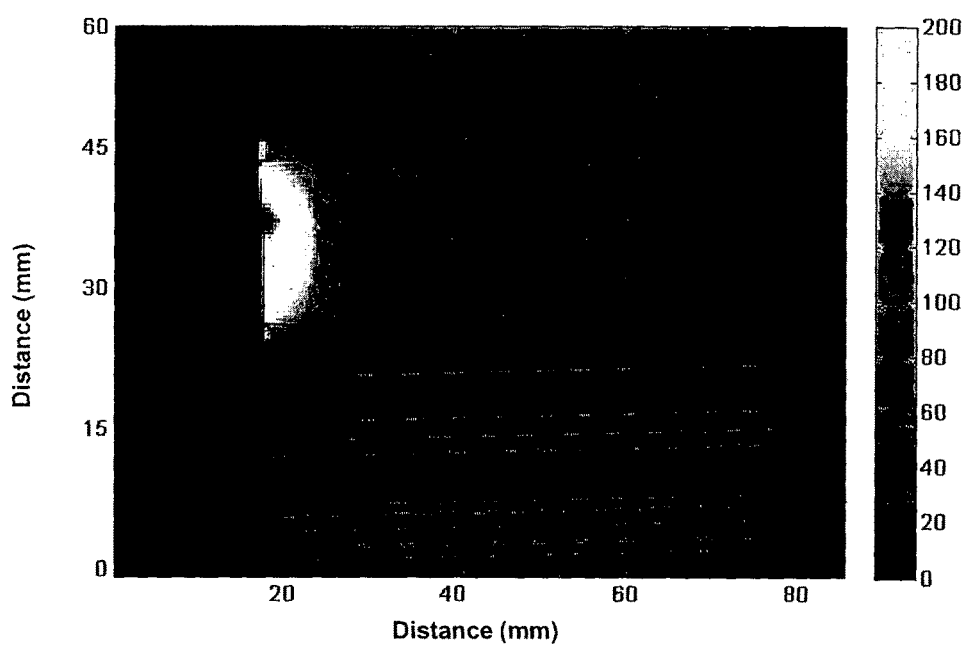
FIG. 11 depicts the enhanced image obtained using the setup illustrated in FIGS. 9 and 10.
Figure 12:
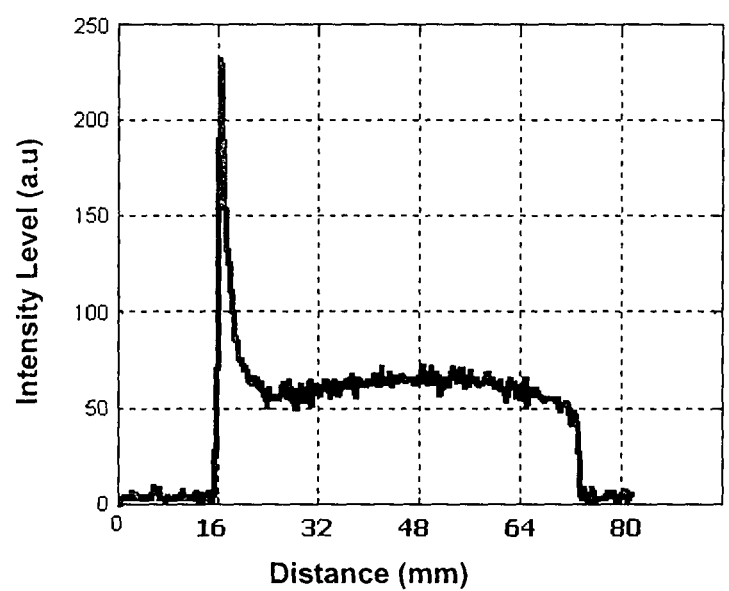
FIG. 12 depicts the intensity distribution of the MR signal that is detected using the setup illustrated in FIGS. 9 and 10.

FIG. 10 depicts the cross-section of phantom (950) that was imaged by MRI device (910) in an enhanced fashion using resonator (970). The enhanced image obtained is depicted in FIG. 11, which is the MRI image of phantom (950) along imaging slice (960). As is apparent from observation of this image, a bright spot is obtained on imaging slice (960) in the vicinity of resonator (970). This bright spot corresponds to the enhancement of the MRI image that is obtained when resonator (970) is placed and used as depicted in FIGS. 9 and 10 during MR imaging. FIG. 12 depicts the intensity distribution of the MR signal that is detected as a function of position along the plane formed by imaging slice (960) and in the direction that is substantially normal to the large-surface area surface of resonator (970). As is apparent from observation of this plot, an intensity enhancement of a factor of approximately five is obtained in the vicinity of resonator (970).

Figure 13:
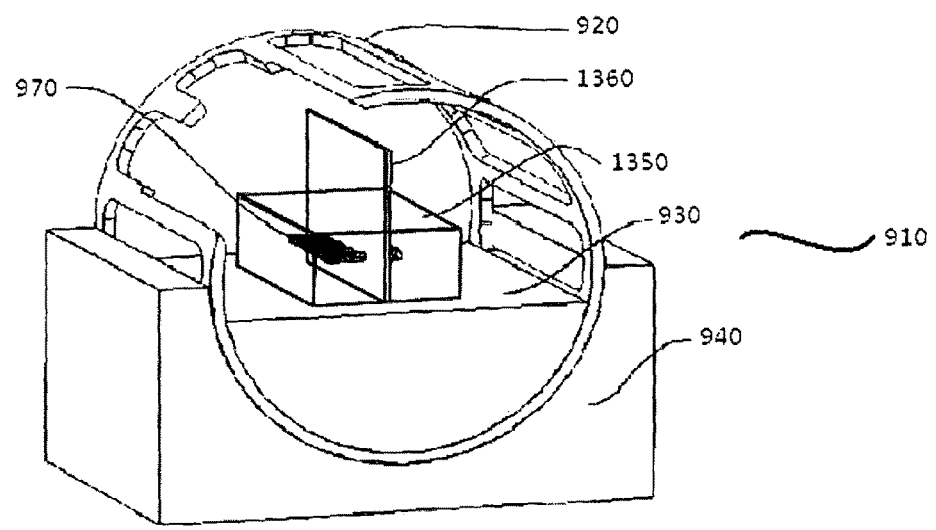
FIG. 13 depicts a testing setup (910) used to model ex vivo and in vivo behavior of a MRI image enhancement device comprising a helical resonator (970) in accordance with an embodiment of this invention. The helical resonator (970) depicted in FIG. 13 is placed and used as an in vivo device.

Example 2: Testing of an Embodiment of the Invention as an In Vivo MRI Image Enhancement Device FIG. 13 depicts a testing setup used to model the behavior of resonator (970). The testing setup of FIG. 13 is substantially similar to that of FIG. 9, except that resonator (970) has been inserted within phantom (1350), and has been placed substantially parallel to the rectangularly shaped end surface of supporting pad (930). As such, imaging slice (1360) in this embodiment lies along a sagittal plane (i.e., as depicted in FIG. 13, the plane containing imaging slice (1360) that is normal to the large-surface area surfaces of resonator (970).

Figure 14:
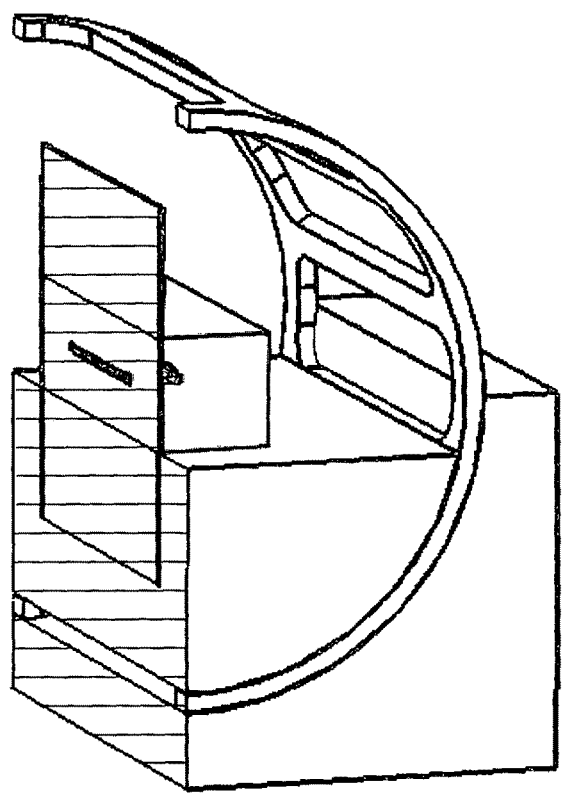
FIG. 14 depicts the cross-section (1360) of the phantom (1350) that was imaged by the MRI device and the resonator (970) of the embodiment of FIG. 13, wherein the helical resonator was used as an in vivo device.
Figure 15:
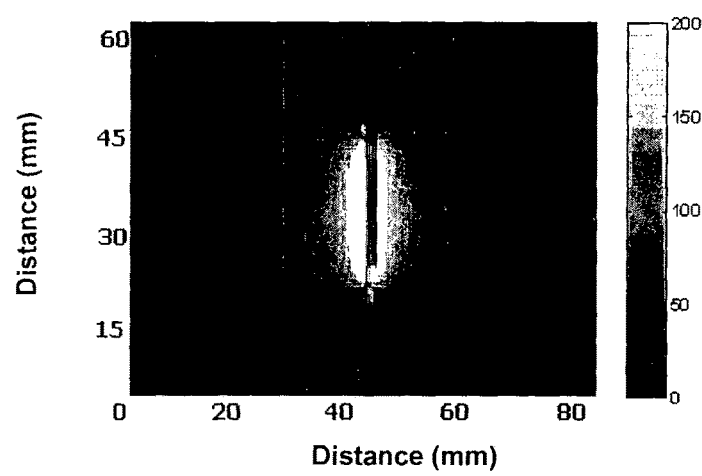
FIG. 15 depicts the enhanced image obtained using the setup illustrated in FIGS. 13 and 14.
Figure 16:
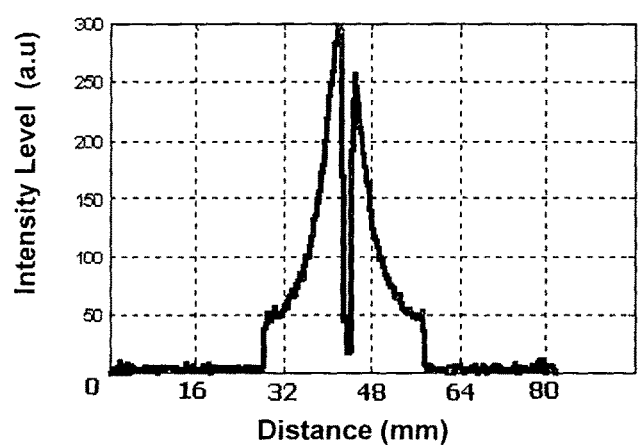
FIG. 16 depicts the intensity distribution of the MR signal that is detected using the setup illustrated in FIGS. 13 and 14.

FIG. 14 depicts the cross-section of phantom (1350) that was imaged by MRI device (910) in an enhanced fashion, using resonator (970). The enhanced image obtained is depicted in FIG. 15, which is the MRI image of phantom (1350) along imaging slice (1360). As is apparent from observation of this image, a bright spot is obtained on imaging slice (1360) in the vicinity of resonator (970). This bright spot corresponds to the enhancement of the MRI image that is obtained when resonator (970) is placed and used as depicted in FIG. 13 during MR imaging. FIG. 16 depicts the intensity distribution of the MR signal that is detected as a function of position along the plane formed by imaging slice (1360) and in the direction that is substantially normal to the large-surface area surfaces of resonator (970). As is apparent from observation of this plot, an intensity enhancement of a factor of approximately five is obtained in the vicinity of resonator (970).

Example 3: Comparison of an Embodiment with the Proposed Solution of FIG. 2E of U.S. 2010/127707

Resonators in SRR geometries have been previously proposed in the literature for applications such as MR image enhancement. For example, U.S. 2010/127707 proposes several SRR geometries. Thin film loading of the SRR structure is known to decrease the resonance frequency of the resonator and render the resonator more compact for implantation applications. This application in FIG. 2E proposes a two-layer of SRR geometry with an insulating layer, but without any conductive connection between the two layers through, for example, a vial metallization element. Equivalent circuit analysis and other details are discussed in the referenced patent application, which is herein incorporated by reference in its entirety.

Figure 20:
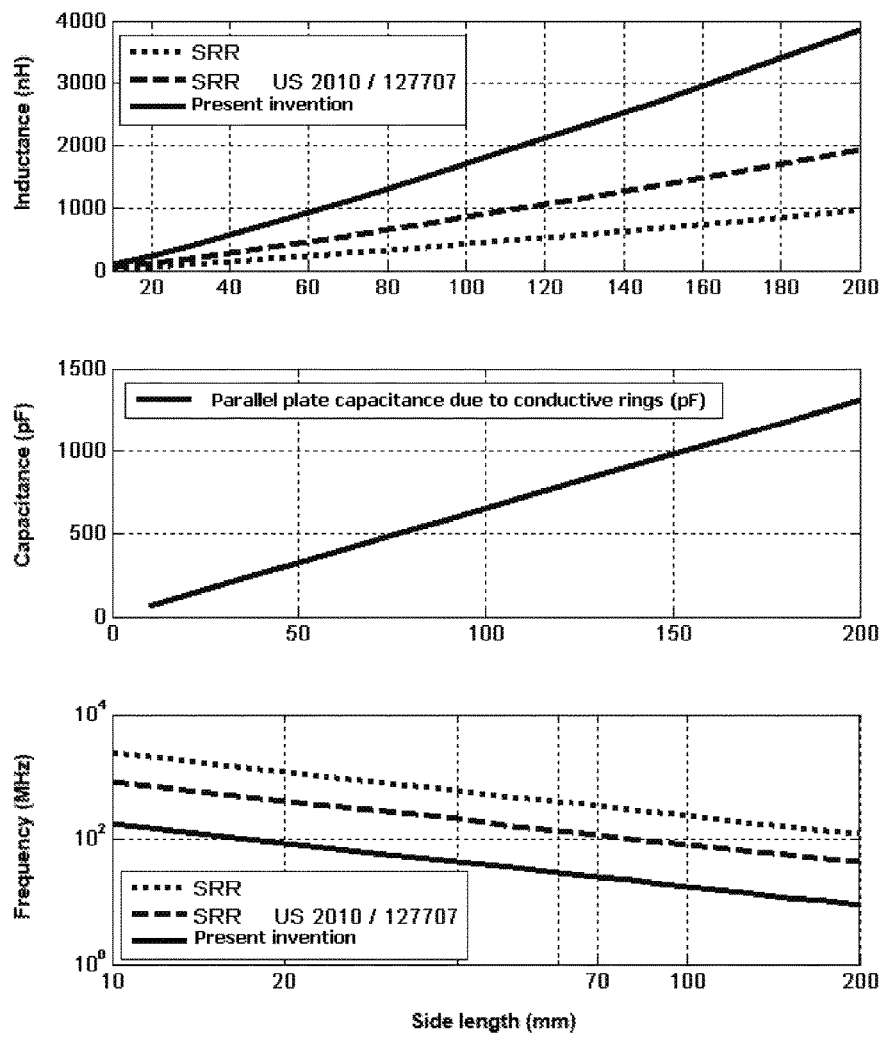
FIG. 20 depicts the results of a simulation comparing the sizes and MRI image enhancement provided by a helical resonator in accordance with the current disclosure and two other previously known resonators.

We observed that this design could not be used for in vivo MRI resonator applications due to its size and the resulting resonance frequency trade-off. FIG. 20 depicts the resonance frequency characteristics of a classical SRR (in particular, the SRR of FIG. 2), the SRR set forth in FIG. 2E of U.S. 2010/127707, and a helical resonator in an embodiment of the current disclosure. These designs were simulated using a commercial full-wave solver (CST Microwave Studio®). A substrate comprising Silicon, and a dielectric layer of Silicon-Nitride ($\varepsilon_r=5$ and thickness=20 μm) was assumed for each of the simulated designs. An MRI image enhancement resonator should resonate at approximately 125 MHz for an MR imaging system using a 3 Tesla static magnetic field. As depicted in FIG. 20, it is clear that it is physically impossible for the classical SRR to resonate at 125 MHz without exceeding the one side length of 20 cm. Such a device cannot, safely and practically, be implanted in vivo. The resonator of FIG. 2E of U.S. 2010/127707 requires a minimum side length of 7 cm to resonate at approximately 125 MHz, given the previously mentioned device dimension parameters. As depicted in FIG. 20, it was surprisingly found through this simulation that the tested embodiment of the current disclosure may have a side length of less than 2 cm (in particular, 1.21 cm) to resonate at approximately 125 MHz. It will be obvious to the person of ordinary skill in the art based on the current disclosure that the thickness of the dielectric material, the width of the metallic lines and the relative permittivity of the dielectric may be adjusted such that the smaller devices may be fabricated. However, helical resonators of the current invention are a predicted to surprisingly achieve smaller dimensions for a given resonance frequency compared to comparable devices involving SRR resonators. The simulation indicates that the helical resonator of the current disclosure would surprisingly achieve a side length/wavelength ratio that is 13.8 times lower than that of that of the classical SRR device and five times lower compared to the device of FIG. 2E of U.S. 2010/127707. This example indicates that the helical resonator embodiments of the current disclosure achieve sufficiently low resonance frequencies for MRI image enhancement purposes in a wider range of physical dimensions for the resonator and with lower bottom limits for such physical dimensions compared to previously known resonators.

Figure 21:
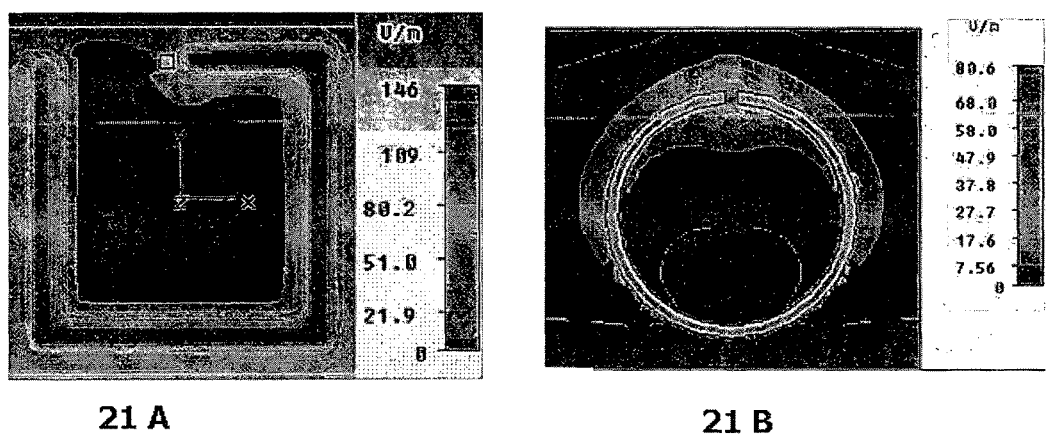
FIG. 21 depicts the electric field confinement in the dielectric layer for each of a helical resonator in accordance with the current disclosure and a previously known resonator.

FIGS. 21A and 21B depict the electric field intensities in the dielectric region for the simulated helical resonator embodiment of the current disclosure and the simulated classical SRR resonator. For similar simulation parameters, FIGS. 21A and 21B indicate that the simulated helical resonator embodiment of the current disclosure has a higher electric field confinement (146 V/m) in the dielectric region than the simulated classical SRR resonator (80.6 V/m). Thus, this simulation indicates that the field confinement and Q-factor value of the simulated helical resonator embodiment of the current disclosure is superior to that of the simulated classical SRR resonator in lossy media.

Embodiments of the present invention have been described for the purpose of illustration. Persons skilled in the art will recognize from this disclosure that the described embodiments are not limiting, and may be practiced with modifications and alterations limited only by the spirit and scope of the appended claims which are intended to cover such modifications and alterations, so as to afford broad protection to the various embodiments of the invention and their equivalents.

Example 4: Comparison of an Embodiment with the Proposed Solution of FIGS. 16A and 16B of U.S. 2007/0239256

It has been reported that lumped RLC circuits, in the form of solenoidal coil geometries, can be used to amplify the EM (electromagnetic) field. FIG. 16 of U.S. 2007/0239256 proposes such a structure with a cylindrical capacitive layer formed by folding two conductive cylindrical sections of a solenoidal structure, which are separated by an insulating cylindrical section, one on top of the other. Due to the classical dimensions of stents (~cm$^3$ in volume), it is possible and feasible to fabricate such devices with RF resonance frequencies around 100 MHz, but the separation of inductive and capacitive regions for in-vivo devices through such lumped structures are not recommended, due to a resulting increase in imaging artifacts and tissue heating effects (hot spots). As discussed earlier, higher electric field confinement in the vicinity of lumped capacitive region (but in an area outside the structure and in the surrounding body tissue) is the main reason for tissue heating and the generation of imaging artifacts. Hence, such lumped structures are not preferred for in-vivo imaging applications. U.S. 2007/0239256 proposes a variety of differently-dimensioned capacitive regions (leading to different values of the capacitance of the lumped structure), but, generally, changing the size of the capacitive region only affects the size of the electric field confinement region and artifact dimensions, and does not prevent the formation of regions subject to tissue heating and imaging artifacts. In particular, and as a general matter, for such lumped structures, a section that includes a larger capacitance (due to a larger capacitive area) results in lower electric field density and a concomitantly less amount of heating of tissue; on the other hand, an increase in the size of the capacitor results in larger artifacts, and lower quality images around the capacitive regions. Conversely, decreasing the size of the capacitor increases confinement of the electric field, leading to more heating of tissue (i.e., hot spots), but smaller or a lesser amount of artifacts in the image.

Example 5: Resonance Frequency Comparison of an Embodiment with the Resonator Proposed in Khennouche et al.

Khennouche et al. proposed to use circular spiral coils separated with a dielectric to increase distributive capacitance to decrease the resonance frequency of a resonator that had compact dimensions. M. S. Khennouche et al., "The Use of Metamaterials: a Solution to Improve the Performance of Radiofrequency Coil for Magnetic Resonance Imaging (MRI)?", Metamaterials '2011: The Fifth International Congress on Advanced Electromagnetic Materials in Microwaves and Optics (2011). They implemented a meta-material architecture to increase the sensitivity of a surface coil, with the estimated overall resonator dimensions reaching a footprint area of nearly 9 cm×9 cm, and achieving a resonance frequency of 125 MHz. The resonator disclosed in the Khennouche et al. is similar those disclosed in U.S. 2010/127707 with spirals instead of circular rings for the upper and bottom rings. Increasing the number of turn of the spiral sections in the upper and bottom rings of the resonator of Khennouche et al. will increase the inductance of the resonator and decrease the resonance frequency. For fixed outer dimensions, addition of each additional circuit to the spiral sections increases the inductance of the Khennouche's resonator at a decreasing rate; additionally, the cumulative effect on the inductance of the inner circuits of the spiral resonator are less than those of the outer circuits. In the Khennouche et al., an embodiment of a resonator could be disclosed that has a footprint area of 9 cm×9 cm, circular spiral sections having four circuits, metallic line widths of 5 mm, and spacing between the adjacent spiral sections is 1.5 mm. The dielectric layer has a thickness of 0.5 mm, with a relative dielectric permittivity of 23. The resonance frequency of the proposed device of the Khennouche et al. is around 134 MHz, whereas an analogous device having similar dimensions that is in accordance with the current embodiments would have a resonance frequency of around 19.4 MHz. Thus, for the same resonance frequency, the side length to wavelength ratio of a device in accordance with the current embodiments is a factor of seven times smaller than that of the proposed solution of the Khennouche et al. Hence, generally, devices in accordance with current embodiments are seven times more compact than the device proposed in the Khennouche et al. Although changing geometric parameters, such as the line width, dielectric thickness, side length, metallic line thickness etc. would affect the resonance frequency of both the device of the Khennouche's device and devices in accordance with the current embodiments, it will be obvious to one of ordinary skill in the art based on the current disclosure that the latter is superior to the device of the Khennouche's device for comparable values of these parameters.

The invention claimed is:

1. A helical resonator for amplifying the intensity of a time-varying magnetic field applied by an MRI device in the vicinity of the resonator compared to the situation in which the resonator is not present, comprising:
   a microfabricated conductive helical ring including at least two turns, and
   a dielectric layer located between the at least two turns of the conductive helical ring, wherein each turn of the at least two turns is non-negligibly capacitively coupled, via the dielectric layer, to at least one other turn of the helical resonator for determining the resonance frequency of the resonator, wherein the helical resonator has outer dimensions within a range of 2 millimeters to 2 centimeters, wherein the at least two turns form a distributed capacitor, and wherein the at least two turns of the helical resonator consist of one full turn and one partial turn.

2. The helical resonator of claim 1 wherein each turn of the at least two turns of the conductive helical ring comprises a conductive path that has a substantially semicircular or polygonal cross section.

3. The helical resonator of claim 1 wherein the helical resonator is manufactured by microfabrication.

4. The helical resonator of claim 1 wherein the dielectric layer is a planar, thin-film dielectric that is formed substantially in the spacing between a first turn and a second turn of the at least two turns.

5. The helical resonator of claim 1 additionally comprising at least one via metallization, and wherein each turn of the at least two turns of the conductive helical ring comprises a conductive path that has (i) a substantially semi-circular or polygonal cross section, and (ii) a gap, and wherein each of the gaps of the at least two turns are substantially aligned, and wherein the at least one via metallization conductively connects the at least two turns.

6. The helical resonator of claim 5 wherein the at least one via metallization conductively connects the at least two turns across their substantially aligned gaps.

7. The helical resonator of claim 6 wherein the semicircular or polygonal cross section of each turn of the helical resonator has a cross-sectional area less than approximately 1 $cm^2$.

8. The helical resonator of claim 6 wherein the resonance frequency of the helical resonator has a value that is between approximately 21.2 MHz and 300 MHz.

9. The helical resonator of claim 7 wherein the dielectric layer is planar and has a large-surface surface area of less than approximately 1.2 $cm^2$.

10. A helical resonator for amplifying the intensity of a time-varying magnetic field applied by an MRI device in the vicinity of the resonator compared to the situation in which the resonator is not present, the helical resonator including a conductive helical ring, being characterized in that:
   the conductive helical ring includes at least two turns, has outer dimensions within a range of 2 millimeters to 2 centimeters and is microfabricated;
   each turn of the at least two turns is non-negligibly capacitively coupled, via the dielectric layer, to at least one other turn of the helical resonator for determining the resonance frequency of the resonator;
   a thin-film dielectric layer is located between the at least two turns of the conductive helical ring;
   the at least two turns form a distributed capacitor, and wherein the at least two turns of the conductive helical ring consist of one full turn and one partial turn.

11. The helical resonator of claim 10 wherein each turn of the at least two turns has a non-negligible length in a direction substantially parallel to the main axis of the helical ring.

12. The helical resonator of claim 10 wherein each turn of the at least two turns of the conductive helical ring comprises a conductive path that has a substantially semicircular or polygonal cross section.

13. The helical resonator of claim 10 wherein each turn of the at least two turns has a non-negligible width in a plane substantially perpendicular to a main axis of the helical ring.

14. The helical resonator of claim 10 wherein the helical resonator is manufactured by microfabrication, and wherein the helical resonator does not include a wired connection to the MRI device.

15. The helical resonator of claim 10 additionally comprising at least one via metallization, and wherein each turn of the at least two turns of the conductive helical ring comprises a conductive path that has (i) a substantially semi-circular or polygonal cross section, and (ii) a gap, and wherein each of the gaps of the at least two turns are substantially aligned, and wherein the at least one via metallization conductively connects the at least two turns.

16. The helical resonator of claim 15 wherein the at least one via metallization conductively connects the at least two turns across their substantially aligned gaps.

17. The helical resonator of claim 16 wherein the semicircular or polygonal cross section of each turn of the helical resonator has a cross-sectional area less than approximately 1 $cm^2$.

18. The helical resonator of claim 17 wherein the planar dielectric has a large-surface surface area of less than approximately 1.2 $cm^2$.

* * * * *